US012681070B2

(12) United States Patent
Huang et al.

(10) Patent No.: US 12,681,070 B2
(45) Date of Patent: Jul. 14, 2026

(54) SYSTEM FOR DETERMINING TRANSISTOR OPERATING CHARACTERISTICS

(71) Applicant: Taiwan Semiconductor Manufacturing Company, Ltd., Hsinchu (TW)

(72) Inventors: Ping-Hsiang Huang, Taichung City (TW); Chu Fu Chen, Zhubei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 296 days.

(21) Appl. No.: 18/624,250

(22) Filed: Apr. 2, 2024

(65) Prior Publication Data

US 2025/0306080 A1      Oct. 2, 2025

(51) Int. Cl.
G01R 31/26 (2020.01)

(52) U.S. Cl.
CPC ................................ G01R 31/2607 (2013.01)

(58) Field of Classification Search
CPC .................................................. G01R 31/2607
See application file for complete search history.

(56) References Cited

U.S. PATENT DOCUMENTS 12,153,089 B2 * 11/2024 Lai .................... G01R 31/31724
2009/0210760 A1    8/2009 Eckelman et al.

2010/0244878 A1 *  9/2010 Yamada ................ H03L 7/0995
                                                     324/750.3
2010/0315114 A1 * 12/2010 Pelgrom ............ G01R 31/2884
                                                     324/762.01
2011/0193586 A1    8/2011 Kuo et al.
2012/0074981 A1    3/2012 Luo et al.
2012/0319720 A1 * 12/2012 Tu ...................... G01R 31/2614
                                                     324/762.08
2017/0141762 A1 *  5/2017 Uemura ................ H03K 3/011
2018/0152178 A1 *  5/2018 Tseng ................ G01R 31/2882
2020/0212895 A1 *  7/2020 Muellner ............ H03K 3/0315

FOREIGN PATENT DOCUMENTS

CN              110007200 A      7/2019

* cited by examiner

*Primary Examiner* — Dominic E Hawkins
(74) *Attorney, Agent, or Firm* — Eschweiler & Potashnik, LLC

(57) ABSTRACT

A system includes a current source, a current supply circuit, a first test transistor, a second test transistor, a measurement circuit, and a ring oscillator circuit. The current supply circuit has a first terminal coupled to a first voltage supply terminal, a second terminal coupled to a first terminal of the current source, and a third terminal. The first test transistor and the second test transistor have first terminals coupled to the third terminal of the current supply circuit and second terminals coupled to a second voltage supply terminal. The measurement circuit has a first terminal coupled to the third terminal of the current supply circuit and a second terminal coupled to the current source. The ring oscillator circuit has a first terminal coupled to a control terminal of the first test transistor and a second terminal coupled to a control terminal of the second test transistor.

20 Claims, 16 Drawing Sheets

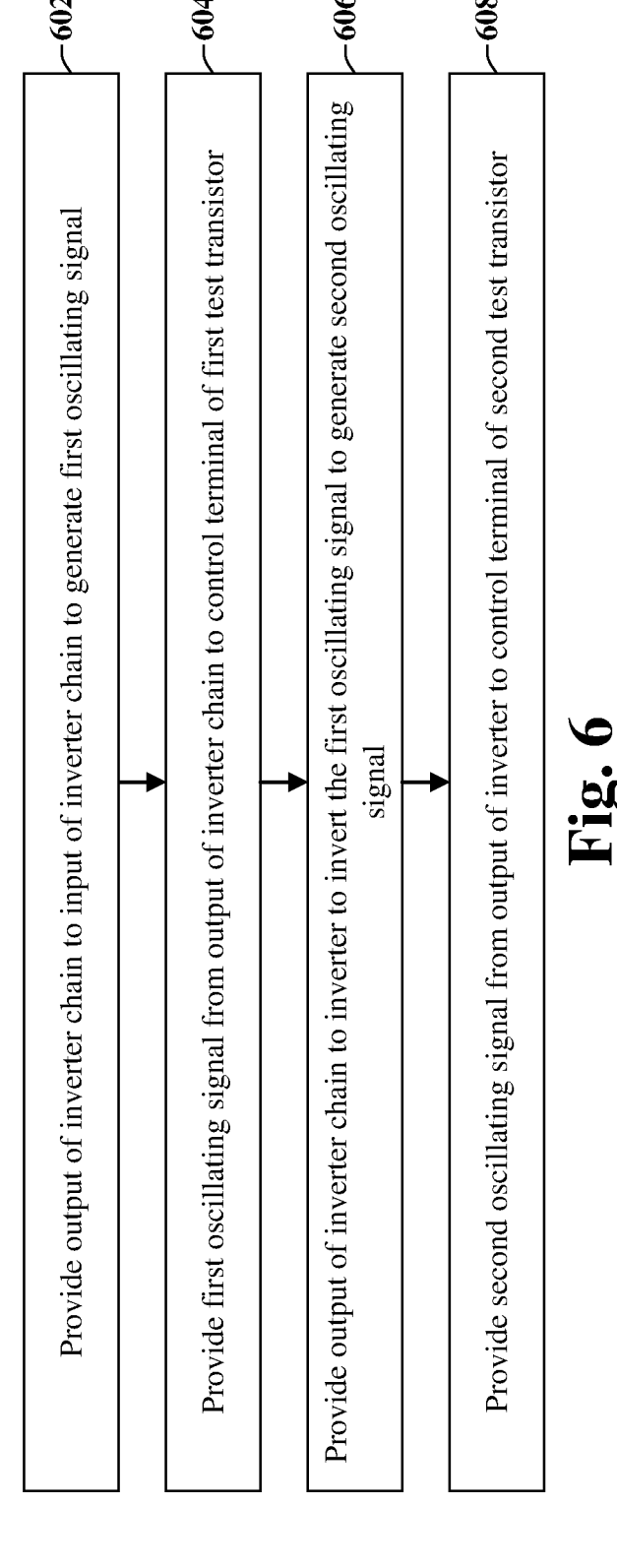

600

602 Provide output of inverter chain to input of inverter chain to generate first oscillating signal 604 Provide first oscillating signal from output of inverter chain to control terminal of first test transistor 606 Provide output of inverter chain to inverter to invert the first oscillating signal to generate second oscillating signal 608 Provide second oscillating signal from output of inverter to control terminal of second test transistor

Fig. 6

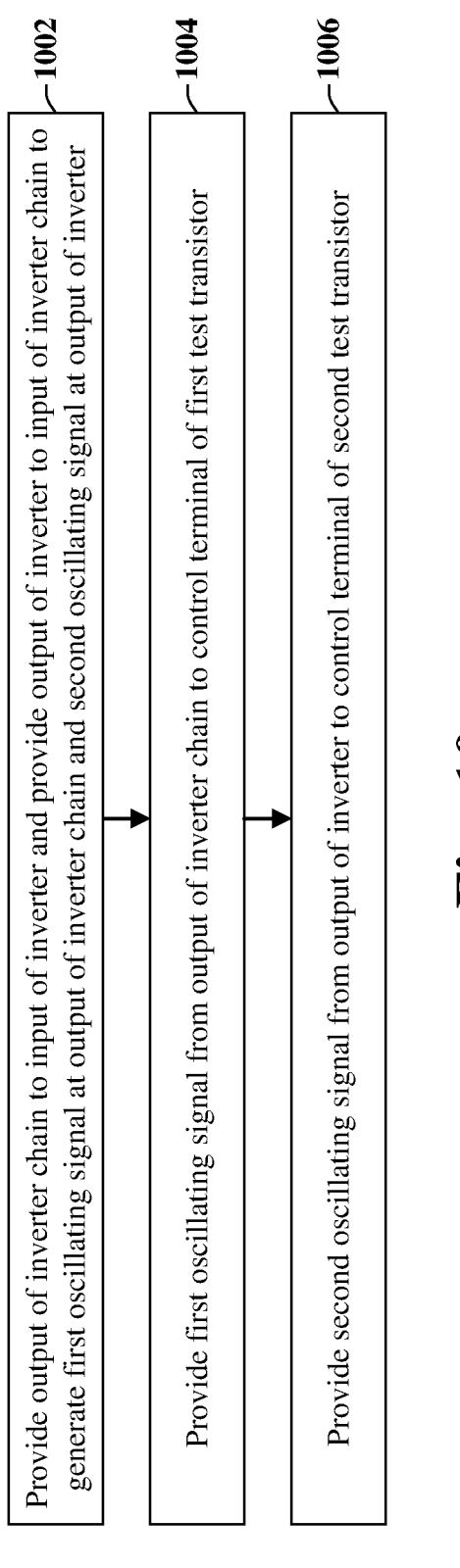

1000

1002 — Provide output of inverter chain to input of inverter to input of inverter chain to provide output of inverter to input of inverter chain and second oscillating signal at output of inverter chain to generate first oscillating signal at output of inverter 1004 — Provide first oscillating signal from output of inverter chain to control terminal of first test transistor 1006 — Provide second oscillating signal from output of inverter to control terminal of second test transistor

Fig. 10

SYSTEM FOR DETERMINING TRANSISTOR OPERATING CHARACTERISTICS

BACKGROUND

As technology advances at a rapid pace, engineers work to make devices smaller, yet more complex to improve and develop electronic devices that are more efficient, more reliable, and have more capabilities. One way to achieve these goals is by improving the design of transistors, as electronic devices comprise a plethora of transistors that together, carry out the function of the device. Overall electronic device performance may benefit from transistors that, for example, are smaller, consume less power, and have faster switching speeds.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 illustrates a flow diagram of some embodiments of the operation of a ring oscillator in the system of FIG. 4.

FIG. 10 illustrates a flow diagram of some embodiments of the operation of a ring oscillator in the system of FIG. 9.

DETAILED DESCRIPTION

Figure 1:
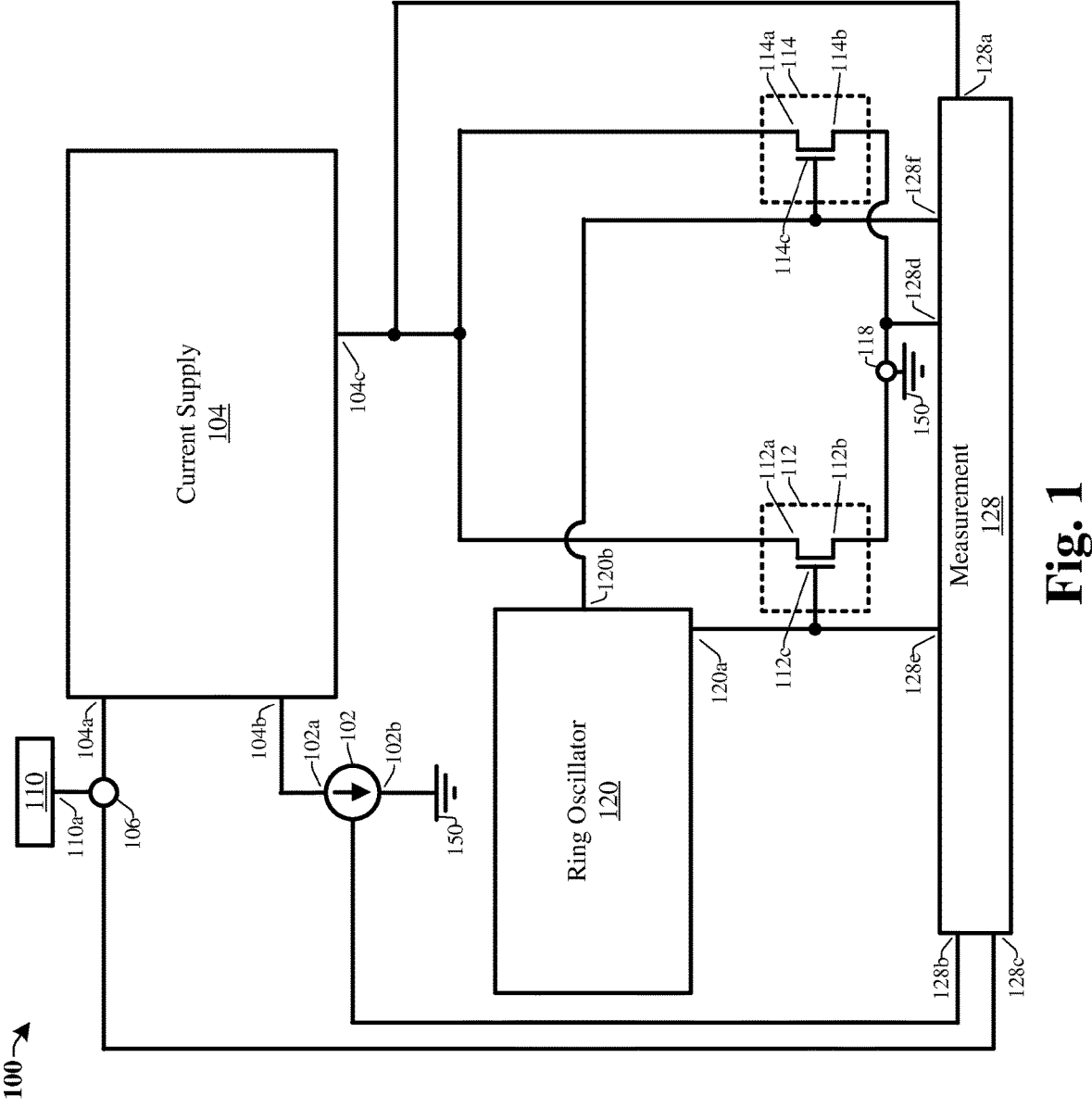
FIG. 1 illustrates a circuit diagram of some embodiments of a system for determining operating characteristics of a plurality of test transistors.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many modern devices include transistors. A transistor includes a first terminal (e.g., a drain), a second terminal (e.g., a source), and a control terminal (e.g., a gate). Transistor operation and performance can vary from transistor to transistor. Thus, it is often important to determine the operating characteristics of transistors after fabrication. Some operating characteristics of a transistor include on-resistance (e.g., the resistance between a first terminal and a second terminal of a transistor when the transistor is on), control terminal charge (e.g., the amount of charge to be applied to the control terminal of a test transistor to turn on the test transistor), threshold voltage, switching loss, conduction loss, and the like.

One method for determining the operating characteristics of a transistor includes applying voltages to the control terminal, the first terminal, and the second terminal of the transistor to cause current to flow through the transistor. The current and the voltages are then measured, and the operating characteristics of the transistor are determined based on the measurements.

A challenge with this method of transistor characterization is that measuring the performance of a single device may not accurately describe how the deice will perform when coupled to, or included in, a larger device with many components. Thus, the operating characteristics determined by this method may be inaccurate.

Various embodiments of the present disclosure are related to a system for determining the operating characteristics of transistors with improved accuracy. In the system, a plurality of intercoupled test transistors are tested together under dynamic conditions to simulate a larger circuit environment. For example, the system includes a current supply circuit which provides current to the test transistors and a ring oscillator circuit which provides oscillating signals to the control terminals of the test transistors to switch the test transistors on and off periodically. A measurement circuit takes measurements (e.g., the voltage across the transistors, the current provided to the transistors, and the like) during the switching, and the measurement circuit determines the operating characteristics of the transistor based on the measurements.

By testing these transistors in an environment which more closely resembles that of a larger device, the transistor operating characteristics determined during the testing may more accurately describe how the transistors would preform if they were included in a larger device. Thus, an accuracy of the characterization may be improved.

FIG. 1 illustrates a circuit diagram 100 of some embodiments of a system for determining operating characteristics of a plurality of test transistors.

The system includes a current source 102 having a first terminal 102a and a second terminal 102b. The second terminal 102b of the current source 102 is coupled to ground 150.

The system further includes a current supply circuit 104 having a first terminal 104a, a second terminal 104b, and a third terminal 104c. The first terminal 104a of the current supply circuit 104 is coupled to a first voltage supply terminal 106. The second terminal 104b of the current supply circuit 104 is coupled to the first terminal 102a of the current source 102.

The system further includes a voltage source 110 (e.g., a battery, a power supply, or the like) coupled to the first voltage supply terminal 106. For example, the voltage source 110 has a first terminal 110a coupled to the voltage supply terminal 106 and a second terminal (not shown) coupled to ground.

The system further includes a plurality of test transistors. For example, in the embodiment illustrated in FIG. 1, the system includes a first test transistor 112 and a second test transistor 114. A first terminal of each test transistor is coupled to the third terminal 104c of the current supply circuit 104. For example, a first terminal 112a of the first test transistor 112 and a first terminal 114a of the second test transistor 114 are coupled to terminal 104c. A second terminal of each test transistor is coupled to a second voltage supply terminal 118. For example, a second terminal 112b of the first test transistor 112 and a second terminal 114b of the second test transistor 114 are coupled to the second voltage supply terminal 118.

In some embodiments, the second voltage supply terminal 118 is coupled to ground 150. In some other embodiments (not shown), the second voltage supply terminal 118 may alternatively be coupled to a second voltage source.

The system further includes a ring oscillator circuit 120. The ring oscillator circuit 120 has a terminal for each test transistor. For example, in the embodiment illustrated in FIG. 1, the ring oscillator circuit 120 has a first terminal 120a coupled to a control terminal 112c of the first test transistor 112 and has a second terminal 120b coupled to a control terminal 114c of the second test transistor 114.

The system further includes a measurement circuit 128 having a first terminal 128a coupled to the third terminal 104c of the current supply circuit 104 and a second terminal 128b coupled to the current source 102. In some embodiments, the measurement circuit 128 has a third terminal 128c coupled to the first voltage supply terminal 106 and a fourth terminal 128d coupled to the second voltage supply terminal 118. In some embodiments, the measurement circuit 128 has a terminal for each test transistor. For example, the measurement circuit 128 has a terminal 128e coupled to the control terminal 112c of the first test transistor 112 and a terminal 128f coupled to the control terminal 114c of the second test transistor 114.

The current source 102 is configured to generate a source current. The current supply circuit 104 is configured to receive the source current at terminal 104b from the current source 102. The current supply circuit 104 is configured to output a supply current at terminal 104c in response to receiving the source current at terminal 104b. In some embodiments, the supply current is approximately equal to a multiple of the source current (e.g., one times the source current, two times the source current, three times the source current, etc.).

The ring oscillator circuit 120 is configured to output an oscillating signal to the control terminal of each of the test transistors. For example, the ring oscillator circuit 120 outputs a first oscillating signal to the control terminal 112c of the first test transistor 112 and outputs a second oscillating signal, different than the first oscillating signal, to the control terminal 114c of the second test transistor 114.

The test transistors are configured to switch on and off based on the oscillating signals. When a test transistor is on, that test transistor passes a current proportional to the supply current. For example, when the first test transistor 112 turns on (according to the first oscillating signal) the first test transistor 112 is configured to pass a first test current, proportional to the supply current, between terminal 112a and terminal 112b. Similarly, when the second test transistor 114 turns on (according to the second oscillating signal), the second test transistor 112 is configured to pass a second test current, proportional to the supply current, between terminal 114a and terminal 114b.

The measurement circuit 128 is configured to measure a current at the current source 102 (e.g., the source current) and measure a voltage at the third terminal 104c of the current supply circuit (e.g., the voltage at the first terminal of each of the test transistors) while the transistors are switching on and off. The measurement circuit 128 is configured to determine one or more operating characteristics (e.g., on-resistance, control terminal charge, threshold voltage, switching power loss, conduction power loss, stress voltages, etc.) of the test transistors based on the measured current(s) and the measured voltage(s).

By coupling the test transistors together for characterization, the test transistors are tested in an arrangement which more closely resembles that of a larger device (e.g., a low dropout regulator, a DC-DC converter, an AC-DC converter, etc.). Further, by outputting oscillating signals to the control terminals of the test transistors, the test transistors switch on and off during testing, thereby making the testing dynamic. These testing conditions more accurately simulate the dynamic operation of transistors in a larger device environment. Thus, the measurements taken during the testing may be more accurate and hence the operating characteristics of the test transistors determined during the testing may more accurately describe how the transistors would preform if they were included in a larger device. As a result, an accuracy of the characterization may be improved.

In some embodiments, the test transistors (e.g., transistors 112, 114) are N-channel transistors. In some other embodiments, the test transistors are P-channel transistors. The test transistors may, for example, be or comprise metal-oxide-semiconductor field-effect transistors (MOSFETs), bipolar junction transistors (BJTs), junction field effect transistors, fin field effect transistors, gate all-around field effect transistors, or some other suitable transistors. In some embodiments, each test transistor is the same type of transistor (e.g., a MOSFET, a BTJ, etc. having a similar size and design).

Although the embodiment illustrated in FIG. 1 includes two test transistors, it will be appreciated in some embodiments, the system may include some other number of test transistors (e.g., three test transistors, four test transistors, five test transistors, etc.).

Figures 2, 3:
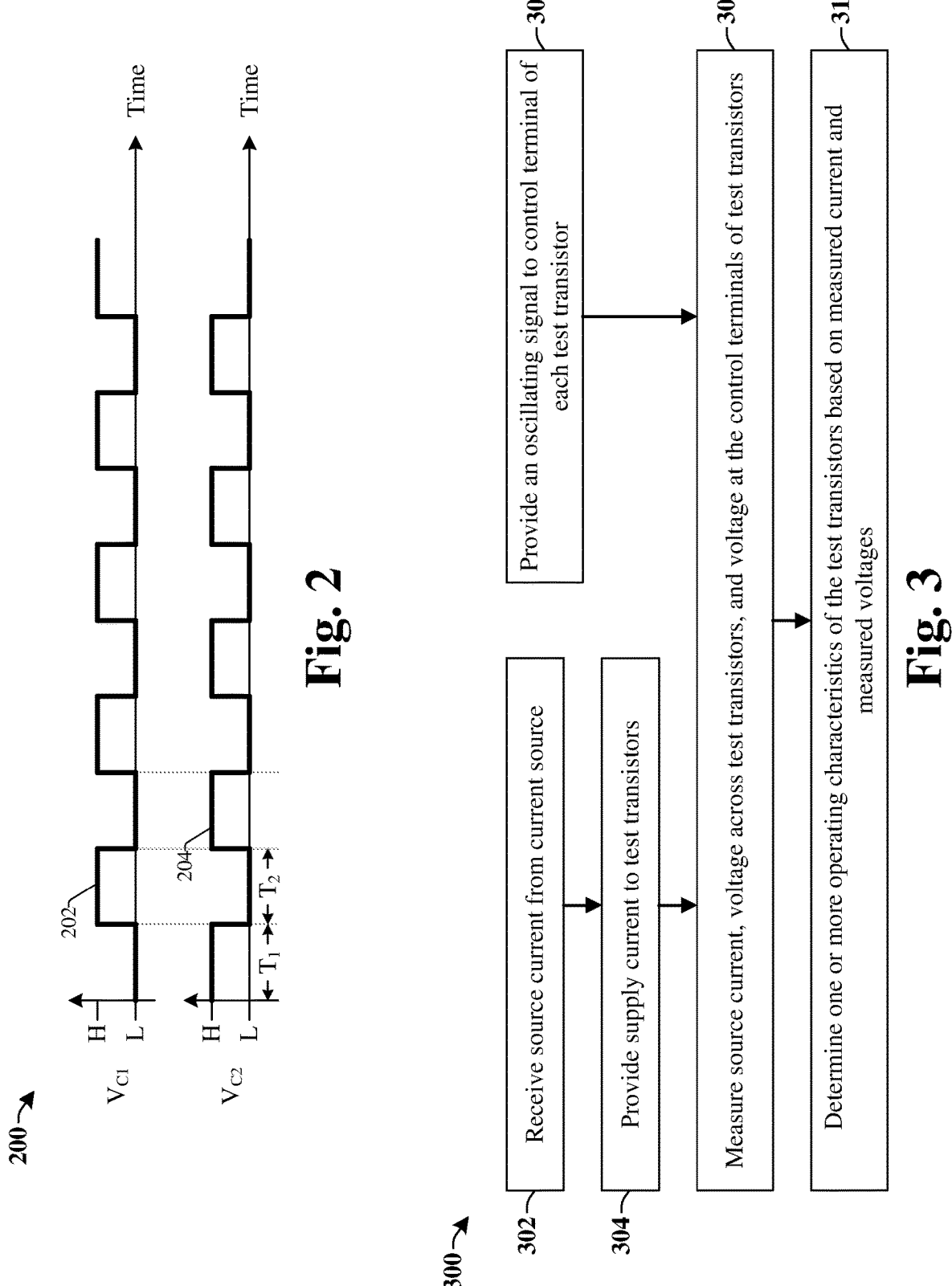
FIG. 2 illustrates a timing diagram corresponding to some embodiments of the system of FIG. 1.
FIG. 3 illustrates a flow diagram of some embodiments of the operation of the system of FIG. 1.

FIG. 2 illustrates a timing diagram 200 corresponding to some embodiments of the system of FIG. 1. Signal 202 shows the voltage $V_{C1}$ at the control terminal 112c of the first test transistor 112 (the first oscillating signal) over time (e.g., as measured by measurement circuit 128 at terminal 128e). Signal 204 shows the voltage $V_{C2}$ at the control terminal 114c of the second test transistor 114 (the second oscillating signal) over time (e.g., as measured by measurement circuit 128 at terminal 128f).

The oscillating signals output to the control terminals of the test transistors oscillate in a complementary manner. For example, signal 202 is at a first voltage state (e.g., a "low" voltage state) during a first period of time $T_1$ and signal 204 is at a second voltage state (e.g., a "high" voltage state), different than the first voltage state, during the first period of time $T_1$. Further, signal 202 is at the second voltage state (e.g., the "high" voltage state) during a second period of time $T_2$ and signal 204 is at the first voltage state (e.g., the "low" voltage state) during the second period of time $T_2$.

FIG. 3 illustrates a flow diagram 300 of some embodiments of the operation of the system of FIG. 1. While the flow diagram 300 of FIG. 3 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At block 302, a source current is received from a current source. For example, current supply circuit 104 receives a source current at terminal 104b from current source 102.

At block 304, in response to receiving the source current, a supply current is provided to the test transistors. For example, current supply circuit 104 provides a supply current at terminal 104c, which is coupled to the first test transistor 112 and the second test transistor 114, in response to receiving the source current at terminal 104b.

At block 306, an oscillating signal is provided to the control terminal of each test transistor. For example, ring oscillator 120 provides a first oscillating signal to the control terminal 112c of the first test transistor 112 and a second oscillating signal to the control terminal 114c of the second test transistor 114.

At block 308, in response to the supply current being provided to the test transistors and the oscillating signals being provided to the control terminals of the test transistors, the source current, the voltage across the test transistors, and the voltage at the control terminals of the test transistors are measured. For example, the measurement circuit 128 measures the source current, the voltage at terminal 104c, the voltage at the control terminal 112c of the first test transistor 112, and the voltage at the control terminal 114c of the second test transistor 114 over a first period of time that is greater than a period of the first and second oscillating signals.

At block 310, in response to measuring the current and voltages, one or more operating characteristics of the test transistors are determined based on the measured current and the measured voltages. For example, the measurement circuit 128 is configured to determine the on-resistance of the first test transistor 112 and the on-resistance of the second test transistor 114 based on the measured voltage at voltage at terminal 104c and the measured source current while the test transistors 112, 114 are switching on and off (e.g., over the first period of time). Further, the measurement circuit 128 is configured to determine control terminal charge of the first test transistor 112 (e.g., the amount of charge at the control terminal 112c of the first test transistor 112 at which the first test transistor 112 turns on) based on the measured voltage at the control terminal 112c of the first test transistor 112 and the measured voltage at terminal 104c while the test transistors 112, 114 are switching on and off (e.g., over the first period of time). Similarly, the measurement circuit 128 is configured to determine the control terminal charge of the second test transistor 114 (e.g., the amount of charge at the control terminal 114c of the second test transistor 114 at which the second test transistor 114 turns on) based on the measured voltage at the control terminal 114c of the second test transistor 114 and the measured voltage at terminal 104c while the test transistors 112, 114 are switching on and off (e.g., over the first period of time).

Figure 4:
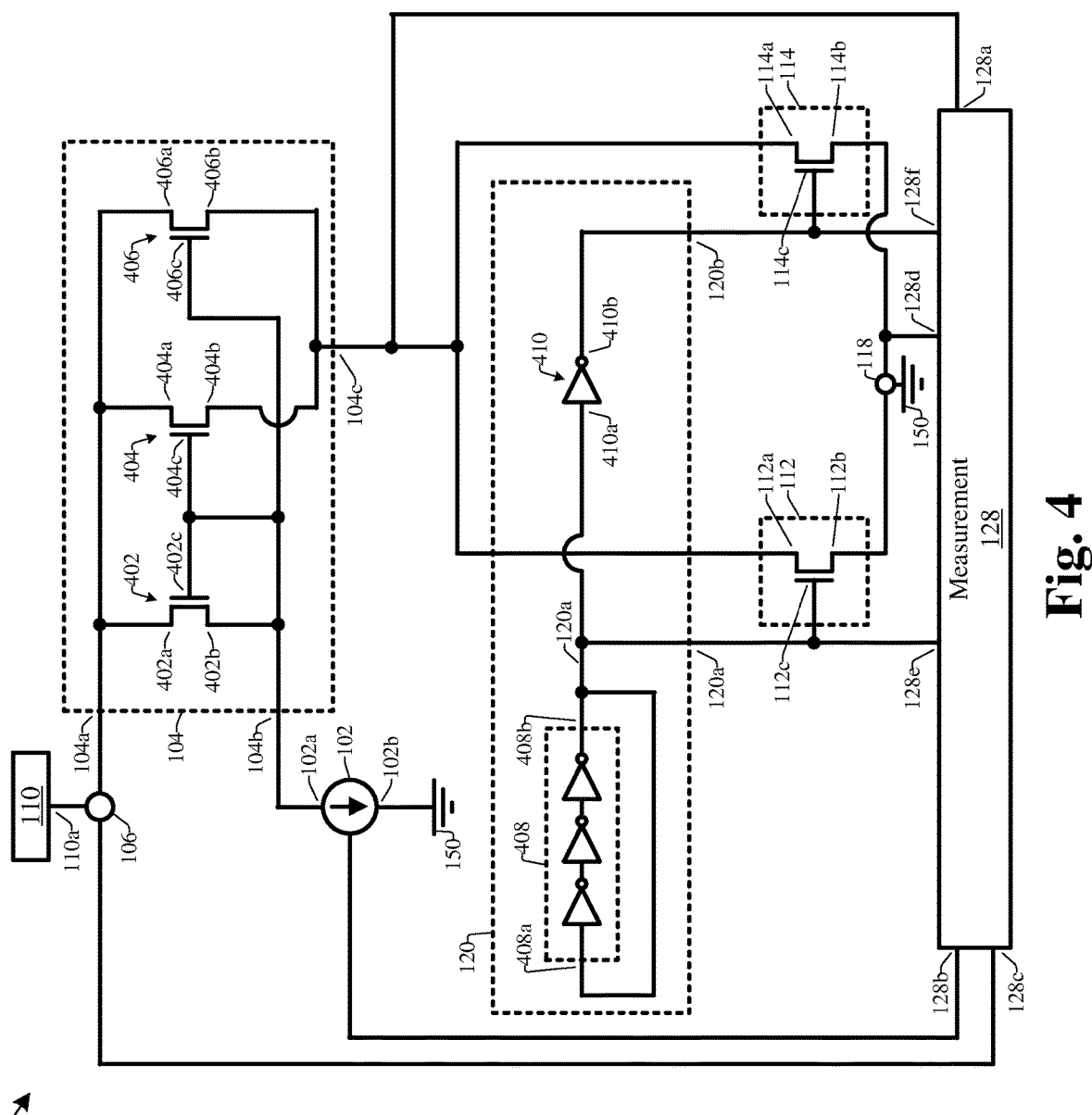
FIG. 4 illustrates a circuit diagram of some other embodiments of the system of FIG. 1.

FIG. 4 illustrates a circuit diagram 400 of some embodiments of the system of FIG. 1 in which the current supply circuit 104 includes a current mirror and the ring oscillator circuit 120 includes a plurality of inverters.

The current mirror includes a primary mirror transistor 402 having a first terminal 402a coupled to the first voltage supply terminal 106, a second terminal 402b coupled to the first terminal 102a of the current source 102, and a control terminal 402c coupled to the second terminal 402b of the primary mirror transistor 402. The current mirror further includes a plurality of secondary mirror transistors having first terminals coupled to the first voltage supply terminal 106, having second terminals coupled to the first terminals of the test transistors, and having control terminals coupled to the control terminal 402c of the primary mirror transistor 402. For example, in the embodiment illustrated in FIG. 4, the current mirror includes a first secondary mirror transistor 404 and a second secondary mirror transistor 406 having first terminals 404a, 406a coupled to the first voltage supply terminal 106, having second terminals 404b, 406b coupled to the first terminals 112a, 114a of the first and second test transistors 112, 114, and having control terminals 404c, 406c coupled to the control terminal 402c of the primary mirror transistor 402.

Each mirror transistor is configured to pass the source current. For example, the primary mirror transistor 402 passes the source current between terminal 402a and terminal 402b. In response, the first secondary mirror transistor 404 passes a first current, which is approximately equal to the source current, between terminal 404a and terminal 404b. Likewise, in response to the primary mirror transistor 402 passing the source current, the second secondary mirror transistor 406 passes a second current, which is approximately equal to the source current, between terminal 406a and terminal 406b. Because the second terminals of the secondary mirror transistors are coupled together, the current supply circuit 104 outputs a supply current at terminal 104c that is approximately equal to the product of the source current multiplied by the number of secondary mirror transistors. For example, in the embodiment illustrated in FIG. 4, the current supply circuit 104 outputs (at terminal 104c) a supply current that is approximately equal to twice the source current. In some embodiments, the number of secondary mirror transistors is equal to the number of test transistors.

The ring oscillator circuit 120 includes an inverter chain 408 comprising an odd-numbered plurality of inverters coupled in series between an input terminal 408a of the first inverter chain 408 and an output terminal 408b of the first inverter chain 408. For example, the inverter chain 408 includes a first inverter (not labeled) having an input coupled to input terminal 408$a$, a second inverter (not labeled) having an input coupled to an output of the first inverter (not labeled), and a third inverter (not labeled) having an input coupled to an output of the second inverter (not labeled) and having an output coupled to output terminal 408$b$. The output terminal 408$b$ of the inverter chain 408 is coupled to the input terminal 408$a$ of the inverter chain 408, thereby forming the "ring" of the ring oscillator circuit 120. Although three inverters are shown in inverter chain 408 illustrated in FIG. 4, it will be appreciated that in some other embodiments, the inverter chain 408 could alternatively comprise some other odd number of inverters (e.g., 5 inverters, 7 inverters, etc.).

The inverter chain 408 generates an oscillating signal (the first oscillating signal). More particularly, because the inverter chain 408 includes an odd number of inverters, the signal at output terminal 408$b$ is inverted relative to the signal at input terminal 408$a$. Because output terminal 408$b$ is coupled to input terminal 408$a$, the signal output at output terminal 408$b$ oscillates periodically.

Each inverter in the inverter chain 408 introduces a delay. As a result, a delay exists between the time an input signal is input at input terminal 408$a$ and an output signal is output at output terminal 408$b$. The total delay is based on the number of inverters in the inverter chain 408 and the period of the periodic oscillating signal at output terminal 408$b$ (the first oscillating signal) is based on the total delay. The ring oscillator circuit 120 outputs this oscillating signal (the first oscillating signal) to the control terminal 112$c$ of the first test transistor 112 through terminal 120$a$.

The ring oscillator circuit 120 further includes an inverter 410. Inverter 410 has an input 410$a$ coupled to the output terminal 408$b$ of the inverter chain 408. Inverter 410 has an output 410$b$ coupled to the control terminal 114$c$ of the second test transistor 114 through terminal 120$b$. Inverter 410 inverts the oscillating signal at output 408$b$, thereby forming an inverted oscillating signal (the second oscillating signal), and outputs the inverted oscillating signal to the control terminal 114$c$ of the second test transistor 114 through terminal 120$b$. Thus, the ring oscillator circuit 120 outputs complementary oscillating signals to the control terminals of the first and second test transistors 112, 114 through terminals 120$a$, 120$b$, respectively. As a result, the test transistors switch (e.g., transition between an "on" state and an "off" state) in a complementary manner. For example, when the first test transistor 112 is on, the second test transistor 114 is off, and vice versa.

In some cases, because the number of inverters between terminal 120$a$ and terminal 120$b$ is substantially less than the number of inverters in the inverter chain 408, the delay between the first oscillating signal and the second oscillating signal may be negligible.

In the embodiment illustrated in FIG. 4, the current through each test transistor is approximately two times the source current. This is because there are two secondary mirror transistors and thus the supply current is approximately two times the source current, but only one of the two test transistors is on at a time, so each test transistor passes the supply current at separate times.

In some embodiments, the mirror transistors (e.g., transistors 402, 404, 406) are P-channel transistors. The mirror transistors may, for example, be or comprise MOSFETs, BJTs, junction field effect transistors, fin field effect transistors, gate all-around field effect transistors, or some other suitable transistors.

Figure 5:
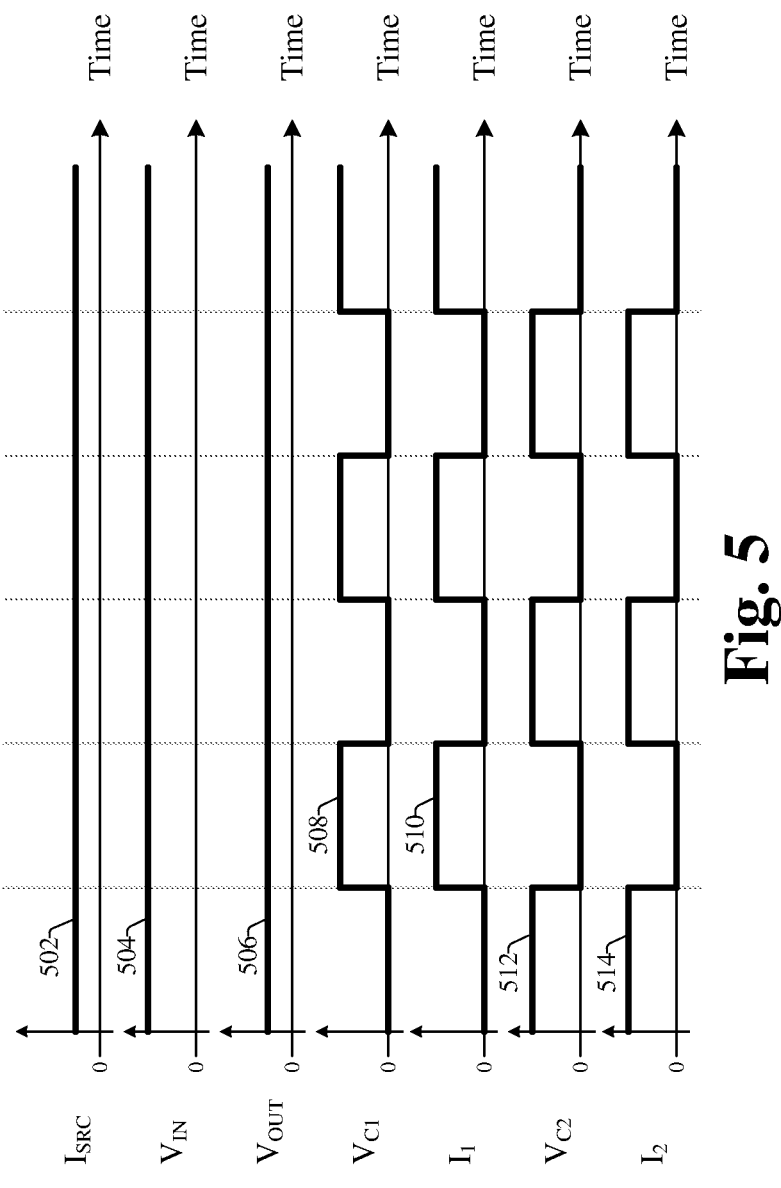
FIG. 5 illustrates a timing diagram corresponding to some embodiments of the system of FIG. 4.

FIG. 5 illustrates a timing diagram 500 corresponding to some embodiments of the system of FIG. 4.

Signal 502 illustrates the source current $I_{SRC}$ generated by current source 102 over time (e.g., as measured by measurement circuit 128 at terminal 128$b$). In some embodiments, the source current $I_{SRC}$ is approximately constant over time.

Signal 504 illustrates the voltage $V_{IN}$ at the first voltage supply terminal 106 over time (e.g., as measured by measurement circuit 128 at terminal 128$c$). The voltage $V_{IN}$ at the first voltage supply terminal 106 is approximately constant over time.

Signal 506 illustrates the voltage $V_{OUT}$ at the third terminal 104$c$ of the current supply circuit 104 over time (e.g., as measured by measurement circuit 128 at terminal 128$a$). The voltage $V_{OUT}$ at terminal 104$c$ is approximately constant over time.

Signal 508 illustrates the voltage $V_{C1}$ at the control terminal 112$c$ of the first test transistor 112 over time (e.g., as measured by measurement circuit 128 at terminal 128$e$). As discussed with regard to FIG. 2, the voltage $V_{C1}$ at the control terminal 112$c$ of the first test transistor 112 oscillates between a first voltage state and a second voltage state.

Signal 510 illustrates the current $I_1$ through the first terminal 112$a$ of the first test transistor 112 over time. In response to the voltage at 112$c$ reaching the second voltage state (the "high" voltage state), current flows through the first test transistor 112 between the first terminal 112$a$ and the second terminal 112$b$. As discussed with regard to FIG. 4, in the embodiment illustrated in FIG. 4, the current $I_1$ through the first test transistor 112 is approximately two times the source current.

Signal 512 illustrates the voltage $V_{C2}$ at the control terminal 114$c$ of the second test transistor 114 over time (e.g., as measured by measurement circuit 128 at terminal 128$f$). As discussed with regard to FIG. 2, the voltage $V_{C2}$ at the control terminal 114$c$ of the second test transistor 114 oscillates between a first voltage state and a second voltage state (complementary to the voltage at control terminal 112$c$).

Signal 514 illustrates the current $I_2$ through the first terminal 114$a$ of the second test transistor 114 over time. In response to the voltage at 114$c$ reaching the second voltage state (the "high" voltage state), current flows through the second test transistor 114 between the first terminal 114$a$ and the second terminal 114$b$. As discussed with regard to FIG. 4, the current $I_2$ through the second test transistor 114 is approximately two times the source current.

FIG. 6 illustrates a flow diagram 600 of some embodiments of the operation of the ring oscillator 120 of FIG. 4. While flow diagram 600 of FIG. 6 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At block 602, an output of an inverter chain is provided to an input of the inverter chain to generate a first oscillating signal at the output of the inverter chain. For example, output terminal 408$b$ is coupled to input terminal 408$a$ of inverter chain 408. Thus, the output of inverter chain 408 is provided to the input of inverter chain 408. As a result, the output of inverter chain 408 oscillates, thereby forming a first oscillating signal at output terminal 408$b$.

At block 604, the first oscillating signal is provided from the output of the inverter chain to the control terminal of the first test transistor. For example, the inverter chain 408 provides the first oscillating signal from output terminal 408b to the control terminal 112c of the first test transistor 112 through terminal 120a of the ring oscillator circuit 120.

At block 606, the output of the inverter chain is provided to an inverter to invert the first oscillating signal inverted to generate a second oscillating signal. For example, output terminal 408b of inverter chain 408 is coupled to input terminal 410a of inverter 410. Thus, the output of the inverter chain 408 is provided to the inverter 410. As a result, inverter 410 receives the first oscillating signal at input terminal 410a and inverts the first oscillating signal, thereby forming the second oscillating signal at output terminal 410b.

At block 608, the second oscillating signal is provided from the output of the inverter to the control terminal of the second test transistor. For example, inverter 410 provides the second oscillating signal from output terminal 410b to the control terminal 114c of the second test transistor 114 through terminal 120b of the ring oscillator circuit 120.

Figure 7:
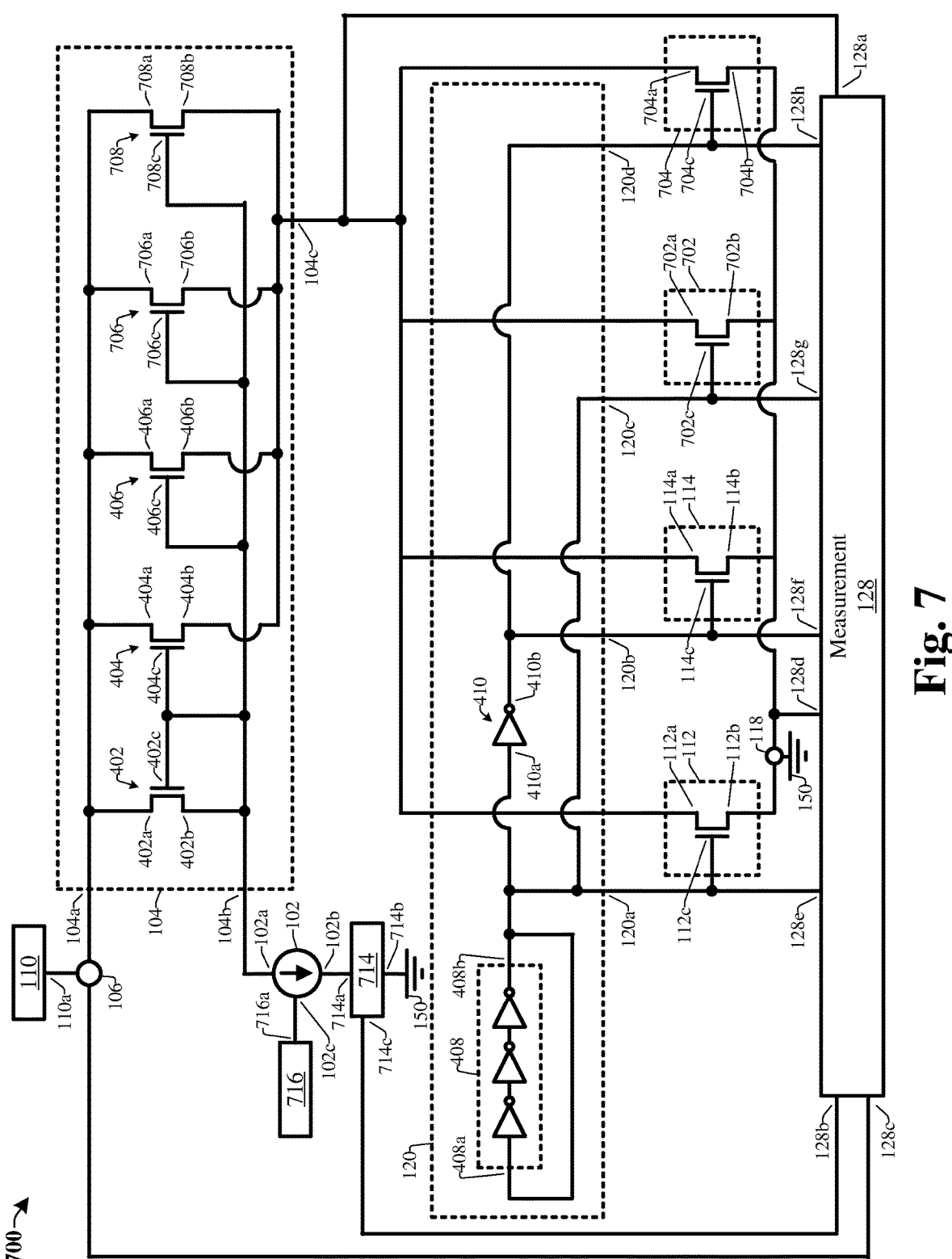
FIG. 7 illustrates a circuit diagram of some other embodiments of the system of FIG. 4.

FIG. 7 illustrates a circuit diagram 700 of some embodiments of the system of FIG. 4, further comprising a third test transistor 702 and a fourth test transistor 704.

The third test transistor 702 and the fourth test transistor 704 have first terminals 702a, 704a coupled to terminal 104c of the current supply circuit 104 and have second terminals 702b, 704b coupled to the second voltage supply terminal 118. The ring oscillator circuit 120 has a third terminal 120c coupled to a control terminal 702c of the third test transistor 702. The ring oscillator circuit 120 has fourth terminal 120d coupled to a control terminal 704c of the fourth test transistor 704. The measurement circuit 128 has a terminal 128g coupled to the control terminal 702c of the third test transistor 702 and has a terminal 128h coupled to the control terminal 704c of the fourth test transistor 704.

Output terminal 408b of inverter chain 408 is coupled to the control terminal of each odd-numbered test transistor. Further, output terminal 410b of inverter 410 is coupled to the control terminal of each even-numbered test transistor. For example, output terminal 408b of inverter chain 408 is coupled to the control terminal 112c of the first test transistor 112 and to the control terminal 702c of the third test transistor 702. Further, output terminal 410b of inverter 410 is coupled to the control terminal 114c of the second test transistor 114 and to the control terminal 704c of the fourth test transistor 704. Thus, the oscillating signal provided to the control terminal of each even-numbered test transistor is inverted relative to the oscillating signal provided to the control terminal of each odd-numbered test transistor. As a result, the even-numbered test transistors and the odd-numbered test transistors switch (e.g., transition between an "on" state and an "off" state, and vice versa) in a complementary manner. For example, when the first test transistor 112 and the third test transistor 702 are on, the second test transistor 114 and the fourth test transistor 704 are off, and vice versa.

Because the odd-numbered and even-numbered test transistors switch in a complementary manner, the odd-numbered test transistors (e.g., the first test transistor 112 and the third test transistor 702) and the even-numbered test transistors (e.g., the second test transistor 114 and the fourth test transistor 704) can differ from one another. For example, in some embodiments, the odd numbered test transistors (e.g., the first test transistor 112) are a first type of transistor (e.g., having a first size and/or design) and the even-numbered test transistors (e.g., the second test transistor 114) are a second type of transistor (e.g., having a second size and/or design), different than the first type.

In some embodiments, as shown in FIG. 7, the current mirror of the current supply circuit 104 further includes a third secondary mirror transistor 706 and a fourth secondary mirror transistor 708 having first terminals 706a, 708a coupled to the first voltage supply terminal 106, having second terminals 706b, 708b coupled to the first terminals 112a, 114a, 702a, 704a of the test transistors 112, 114, 702, 704, and having control terminals 706c, 708c coupled to the control terminal 402c of the primary mirror transistor 402.

Similar to the first secondary mirror transistor 404 and the second secondary mirror transistor 406, the third secondary mirror transistor 706 passes a third current, which is approximately equal to the source current, between terminal 706a and terminal 706b in response to the primary mirror transistor 402 passing the source current. Likewise, the fourth secondary mirror transistor 708 passes a fourth current, which is approximately equal to the source current, between terminal 708a and terminal 708b in response to the primary mirror transistor 402 passing the source current. In the embodiment illustrated in FIG. 5, the current supply circuit 104 outputs (at terminal 104c) a supply current that is approximately equal to four times the source current.

In some embodiments, the system further includes a current sensor 714 coupled to the current source 102. In such embodiments, the second terminal 128b of the measurement circuit 128 is coupled to the current source 102 by the current sensor 714. In some embodiments, the current sensor 714 is coupled between the second terminal 102b of the current source 102 and ground 150. For example, the current sensor 130 has a first terminal 714a coupled to the second terminal 102b of the current source 102, has a second terminal 714b coupled to ground 150, and has a third terminal 714c coupled to the second terminal 128b of the measurement circuit 128. In some other embodiments (not shown), the current sensor is alternatively coupled between the first terminal 102a of the current source 102 and the second terminal 104b of the current supply circuit 104. The current sensor 714 senses the current generated by the current source 102 (e.g., the source current). In some embodiments, the current sensor 714 includes a current sense resistor (not shown) and a current sense amplifier (not shown).

In some embodiments, the system further includes a current control circuit 716 coupled to the current source 102. For example, the current source 102 has a control terminal 102c and the current control circuit 716 has a first terminal 716a coupled to the control terminal 102c. The current control circuit 716 is configured to control the level of the source current generated by the current source 102. For example, the current control circuit 716 is configured to tune the source current to a desirable level based on the number of test transistors that are coupled to the system for testing.

In the embodiment illustrated in FIG. 7, the current through each test transistor is approximately two times the source current. This is because there are four secondary mirror transistors and thus the supply current is approximately four times the source current, but two test transistors are on at a time, so the supply current is divided between the two test transistors. Thus, each test transistor passes approximately half of the supply current.

Although the embodiment illustrated in FIG. 7 shows the system including four test transistors, it will be appreciated that in some other embodiments, the system may include some other number of test transistors (e.g., three test transistors, five test transistors, six test transistors, etc.).

Figure 8:
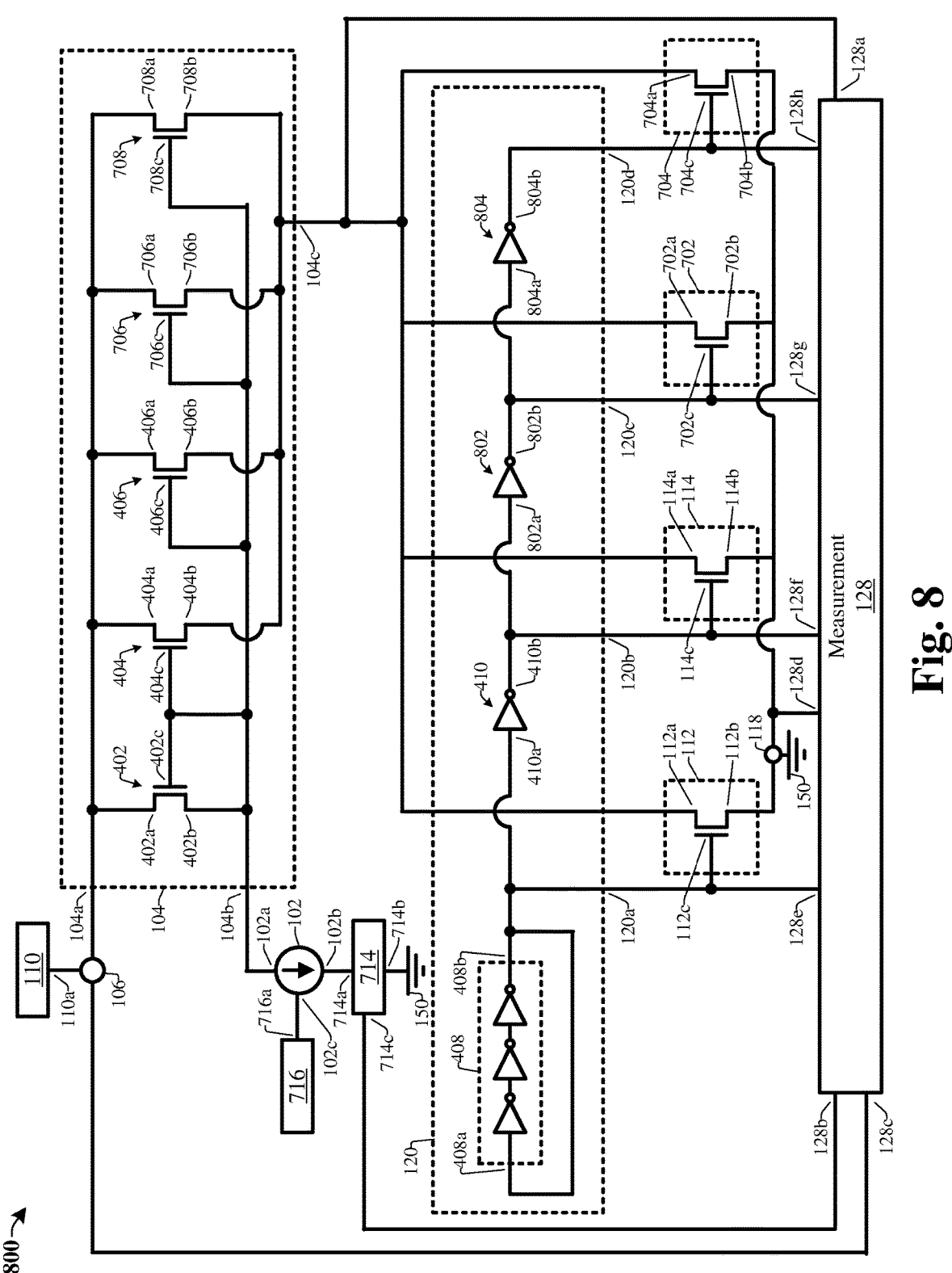
FIG. 8 illustrates a circuit diagram of some other embodiments of the system of FIG. 7.

FIG. 8 illustrates a circuit diagram 800 of some embodiments of the system of FIG. 7 in which the ring oscillator 120 includes a second inverter 802 and a third inverter 804.

The second inverter 802 has an input terminal 802*a* coupled to the output terminal 410*b* of the first inverter 410 and has an output terminal 802*b* coupled to a control terminal 702*c* of the third test transistor 702 through terminal 120*c*. The third inverter 804 has an input terminal 804*a* coupled to the output terminal 802*b* of the second inverter 802 and has an output terminal 804*b* coupled to a control terminal 704*c* of the fourth test transistor 704 through terminal 120*d*.

Inverter 802 inverts the second oscillating signal at output terminal 410*b*, thereby forming a third oscillating signal, and outputs the third oscillating signal to the control terminal 702*c* of the third test transistor 702 through terminal 120*c*. Further, inverter 804 inverts the third oscillating signal at output terminal 802*b*, thereby forming a fourth oscillating signal, and outputs the fourth oscillating signal to the control terminal 704*c* of the fourth test transistor 704 through terminal 120*d*. Thus, the ring oscillator 120 outputs "non-inverted" oscillating signals (e.g., the first oscillating signal and the third oscillating signal) to control terminals of odd numbered test transistors (e.g., the first test transistor 112 and the third test transistor 702) and further outputs "inverted" oscillating signals (e.g., the second oscillating signal and the fourth oscillating signal) to even-numbered test transistors (e.g., the second test transistor 114 and the fourth test transistor 704). Consequently, the even-numbered test transistors and the odd-numbered test transistors switch in a complementary manner. For example, when the first test transistor 112 and the third test transistor 702 are on, the second test transistor 114 and the fourth test transistor 704 are off, and vice versa.

In some examples, the first oscillating and the third oscillating signal are approximately identical. Likewise, the second oscillating signal and the fourth oscillating signal are approximately identical. In some cases, a delay may exist between the first oscillating signal and the third oscillating signal, and between the second oscillating signal and the fourth oscillating signal. However, in many cases, the delay is generally negligible.

Although the embodiment illustrated in FIG. 8 shows the system including four test transistors, it will be appreciated that in some other embodiments, the system may include some other number of test transistors (e.g., three test transistors, five test transistors, six test transistors, etc.).

Figure 9:
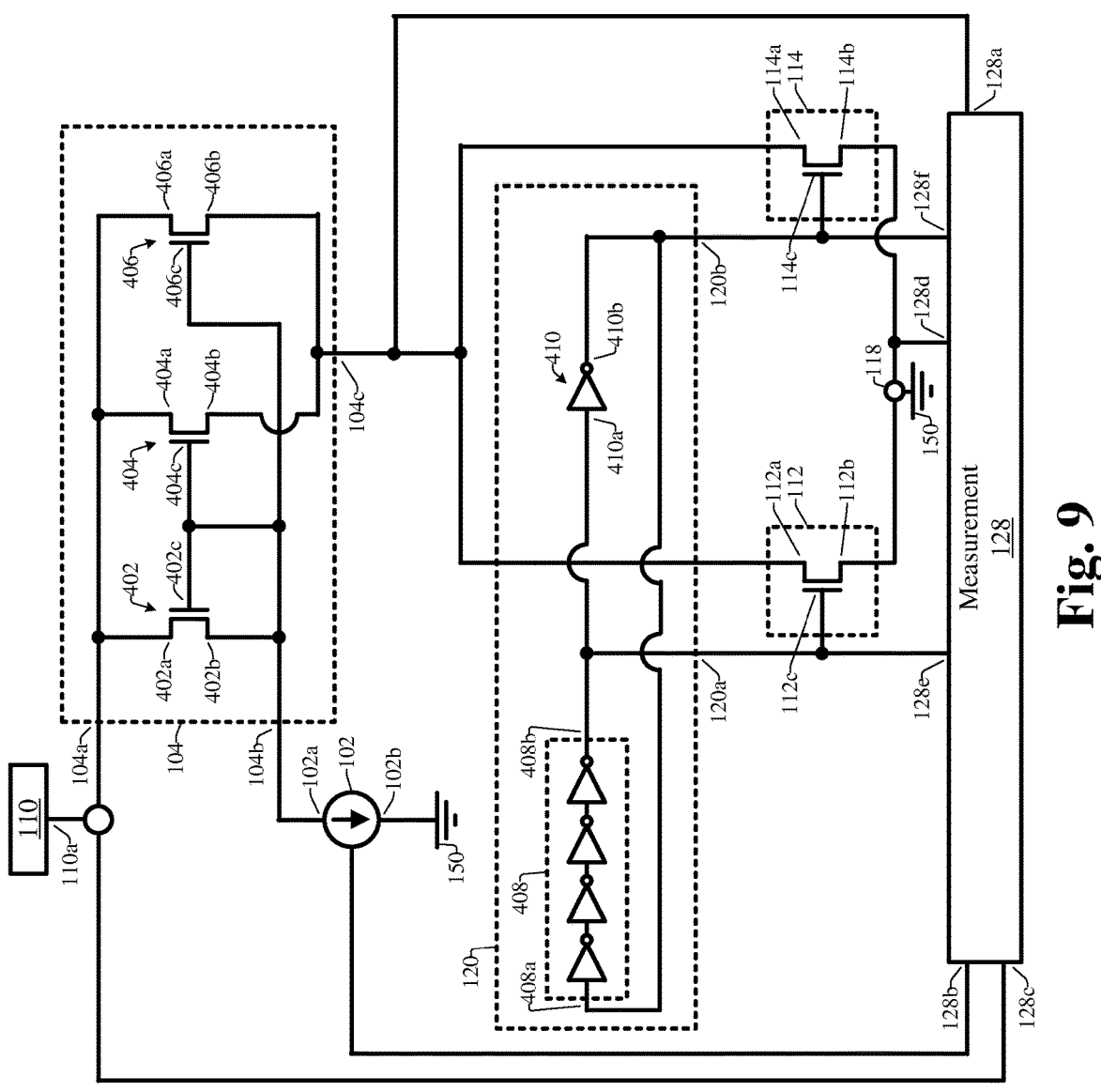
FIG. 9 illustrates a circuit diagram of some other embodiments of the system of FIG. 4.

FIG. 9 illustrates a circuit diagram 900 of some embodiments of the system of FIG. 4 in which the output terminal 410*b* of inverter 410 is coupled to the input terminal 408*a* of inverter chain 408.

Output terminal 408*b* is coupled to control terminal 112*c* and input terminal 410*a*. Output terminal 410*b* is coupled to control terminal 114*c* and to input terminal 408*a*, thereby forming the "ring" of the ring oscillator circuit 120. The system of FIG. 9 operates similar to the system of FIG. 4 (which is shown in the timing diagram 500 of FIG. 5).

The total number of inverters in the ring oscillator circuit 120 is an odd number so that the signals at terminals 120*a*, 120*b* oscillate. For example, when there is an odd number of inverters coupled to the inverter chain 408, the inverter chain 408 has an even number of inverters so that the total number of inverters in the ring oscillator 120 is an odd number. Conversely, when there is an even number of inverters coupled to the inverter chain 408, the inverter chain 408 has an odd number of inverters so that the total number of inverters in the ring oscillator 120 is odd.

FIG. 10 illustrates a flow diagram 1000 of some embodiments of the operation of the ring oscillator 120 of FIG. 9. While flow diagram 1000 of FIG. 10 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At block 1002, the output of the inverter chain is provided to the input of the inverter and the output of the inverter is provided back to the input of input inverter chain to generate the first oscillating signal at the output of the inverter chain and the second oscillating signal at the output of the inverter. For example, output terminal 408*b* of inverter chain 408 is coupled to input terminal 410*a* of inverter 410 and output terminal 410*b* of inverter 410 is coupled to input terminal 408*a* of inverter chain 408. Thus, the output of inverter chain 408 is provided to the input of the inverter 410 and the output of the inverter 410 is provided to the input of the inverter chain 408. As a result, the output of inverter chain 408 oscillates, thereby forming the first oscillating signal, and the output of the inverter 410 oscillates, thereby forming the second oscillating signal.

At block 1004, the first oscillating signal is provided from the output of inverter chain to the control terminal of the first test transistor. For example, inverter chain 408 provides the first oscillating signal from output terminal 408*b* to the control terminal 112*c* of the first test transistor 112 through terminal 120*a* of the ring oscillator circuit 120.

At block 1006, the second oscillating signal is provided from the output of the inverter to the control terminal of the second test transistor. For example, inverter 410 provides the second oscillating signal from output terminal 410*b* to the control terminal 114*c* of the second test transistor 114 through terminal 120*b* of the ring oscillator circuit 120.

Figure 11:
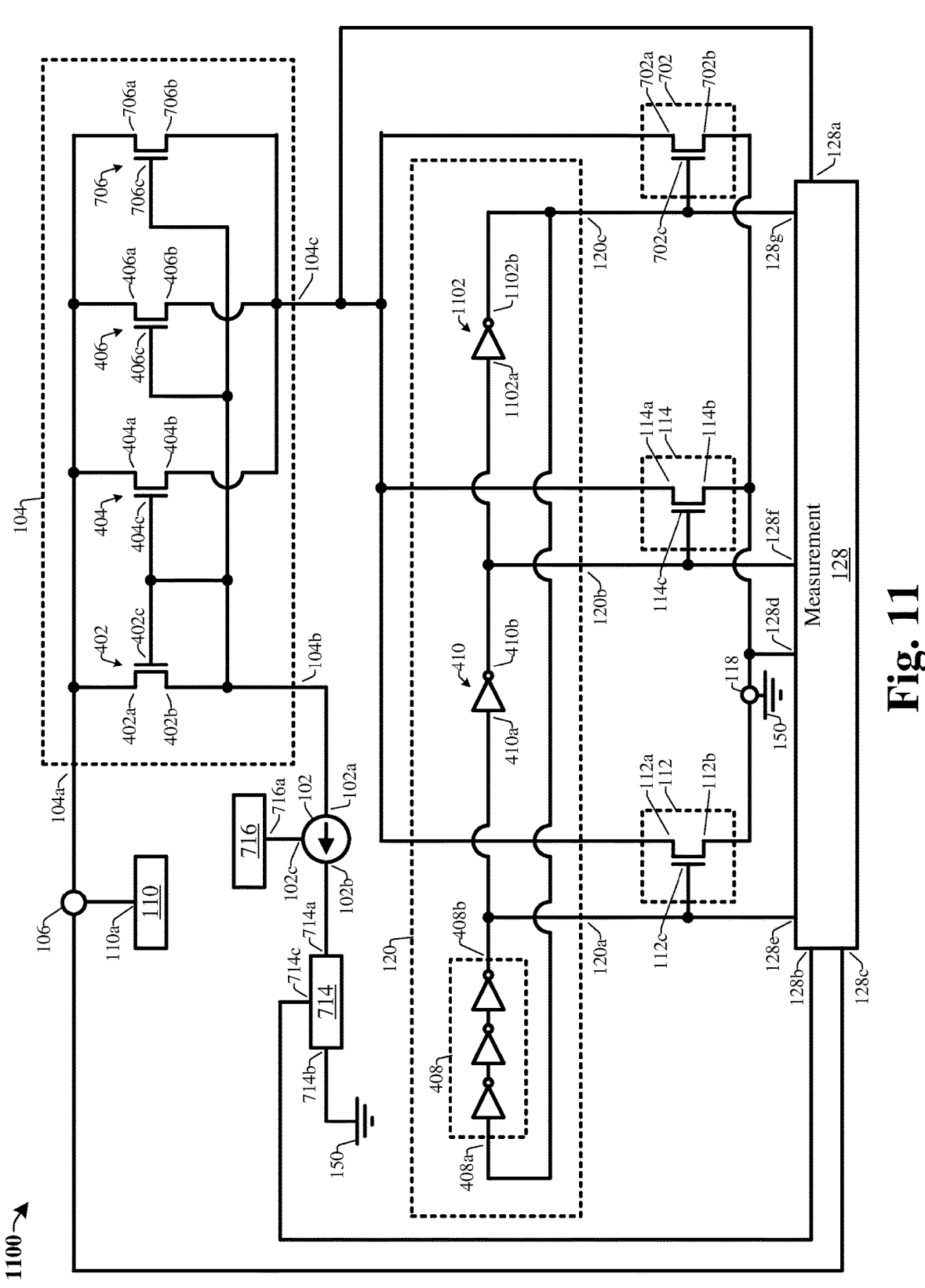
FIG. 11 illustrates a circuit diagram of some other embodiments of the system of FIG. 9.

FIG. 11 illustrates a circuit diagram 1100 of some embodiments of the system of FIG. 9 in which the ring oscillator circuit 120 further comprises a second inverter 1102.

The system includes the first test transistor 112, the second test transistor 114, and the third test transistor 702. The second inverter 1102 is coupled to the first inverter 410. More particularly, an input terminal 1102*a* of the second inverter 1102 is coupled to the output terminal 410*b* of the first inverter 410. Further, an output terminal 1102*b* of the second inverter 1102 is coupled to the input terminal 408*a* of the inverter chain 408, thereby forming the "ring" of the ring oscillator 120. The output terminal 1102*b* of the second inverter 1102 is coupled to the control terminal 702*c* of the third test transistor 702. In the embodiment illustrated in FIG. 11, the first inverting chain 408 includes an odd numbered plurality of inverters so that the total number of inverters in the "ring" of the ring oscillator 120 is an odd number.

Although the embodiment illustrated in FIG. 11 shows the system including three test transistors, it will be appreciated that in some other embodiments, the system may include some other number of test transistors (e.g., four test transistors, five test transistors, six test transistors, etc.).

Figure 12:
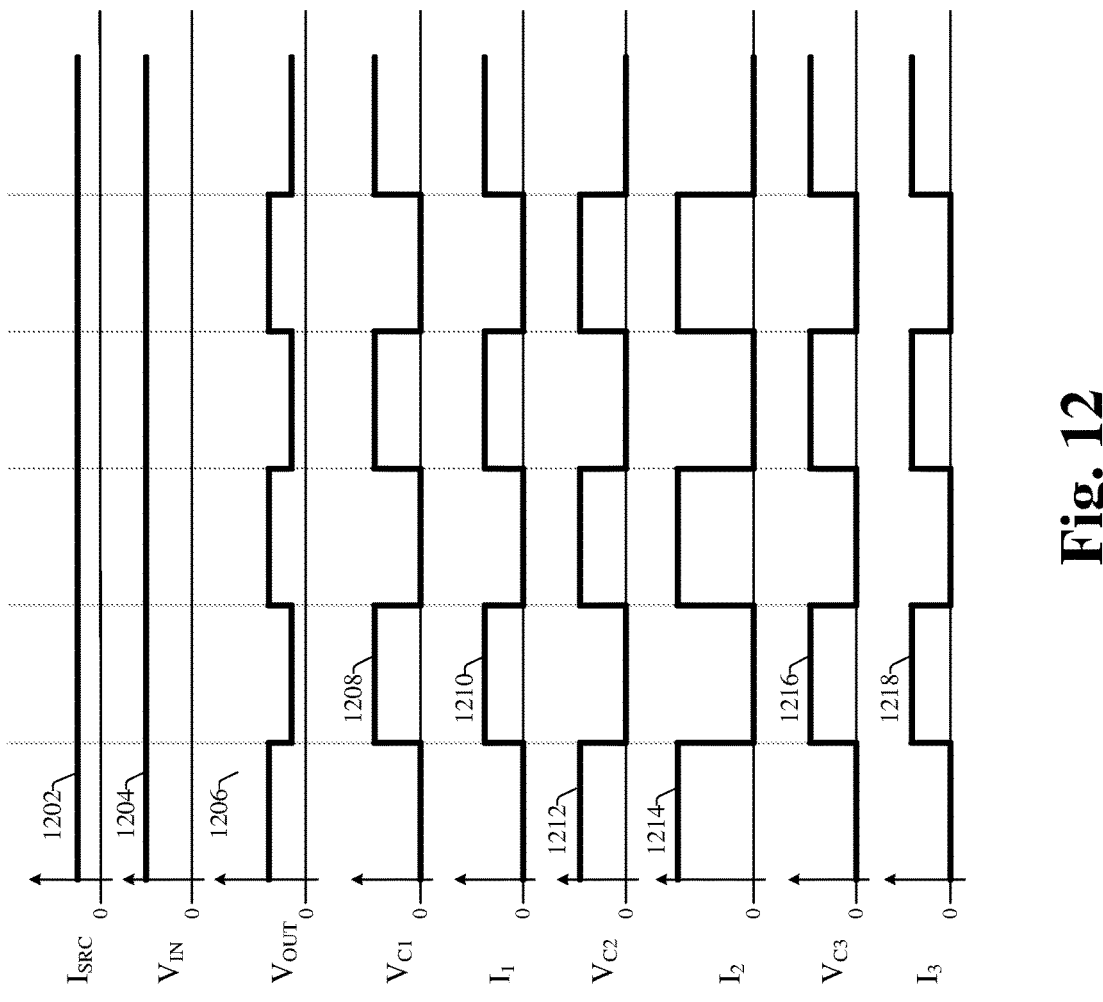
FIG. 12 illustrates a timing diagram corresponding to some embodiments of the system of FIG. 11.

FIG. 12 illustrates a timing diagram 1200 corresponding to some embodiments of the system of FIG. 11.

Signal 1202 illustrates the source current $I_{SRC}$ generated by current source 102 over time (e.g., as measured by measurement circuit 128 at terminal 128b). Signal 1204 illustrates the voltage $V_{IN}$ at the first voltage supply terminal 106 over time (e.g., as measured by measurement circuit 128 at terminal 128c).

Signal 1206 illustrates the voltage $V_{OUT}$ at the third terminal 104c of the current supply circuit 104 over time (e.g., as measured by measurement circuit 128 at terminal 128a). The voltage at terminal 104c oscillates between a first voltage level and a second voltage level in response to the switching of the test transistors. For example, when the first test transistor 112 and the third test transistor 702 are off and the second test transistor 114 is on, the voltage at terminal 104c is at a first voltage level. Further, when the first test transistor 112 and the third test transistor 702 are on and the second test transistor 114 is off, the voltage at terminal 104c is at a second voltage level, less than the first voltage level. When the first and third test transistors 112, 702 are on, there is less resistance between terminal 104c and voltage supply terminal 118. Thus, the voltage at terminal 104c is reduced. When the second test transistor 114 is on, there is greater resistance between terminal 104c and voltage supply terminal 118. Thus, the voltage at terminal 104c is increased.

Signal 1208 illustrates the voltage $V_{C1}$ at the control terminal 112c of the first test transistor 112 over time (e.g., as measured by measurement circuit 128 at terminal 128e).

Signal 1210 illustrates the current $I_1$ through the first terminal 112a of the first test transistor 112 over time. In the embodiment illustrated in FIG. 11, the current through the first test transistor 112 is approximately one and a half times the source current.

Signal 1212 illustrates the voltage $V_{C2}$ at the control terminal 114c of the second test transistor 114 over time (e.g., as measured by measurement circuit 128 at terminal 128f).

Signal 1214 illustrates the current $I_2$ through the first terminal 114a of the second test transistor 114 over time. In the embodiment illustrated in FIG. 11, the current through the second test transistor 114 is approximately three times the source current.

Signal 1216 illustrates the voltage $V_{C3}$ at the control terminal 702c of the third test transistor 702 over time (e.g., as measured by measurement circuit 128 at terminal 128g). The voltage at the control terminal 702c of the third test transistor 702 is approximately equal to the voltage at the control terminal 112c of the first test transistor 112.

Signal 1218 illustrates the current $I_3$ through the first terminal 702a of the third test transistor 702 over time. In the embodiment illustrated in FIG. 11, the current through the third test transistor 702 is approximately one and a half times the source current.

Figure 13:
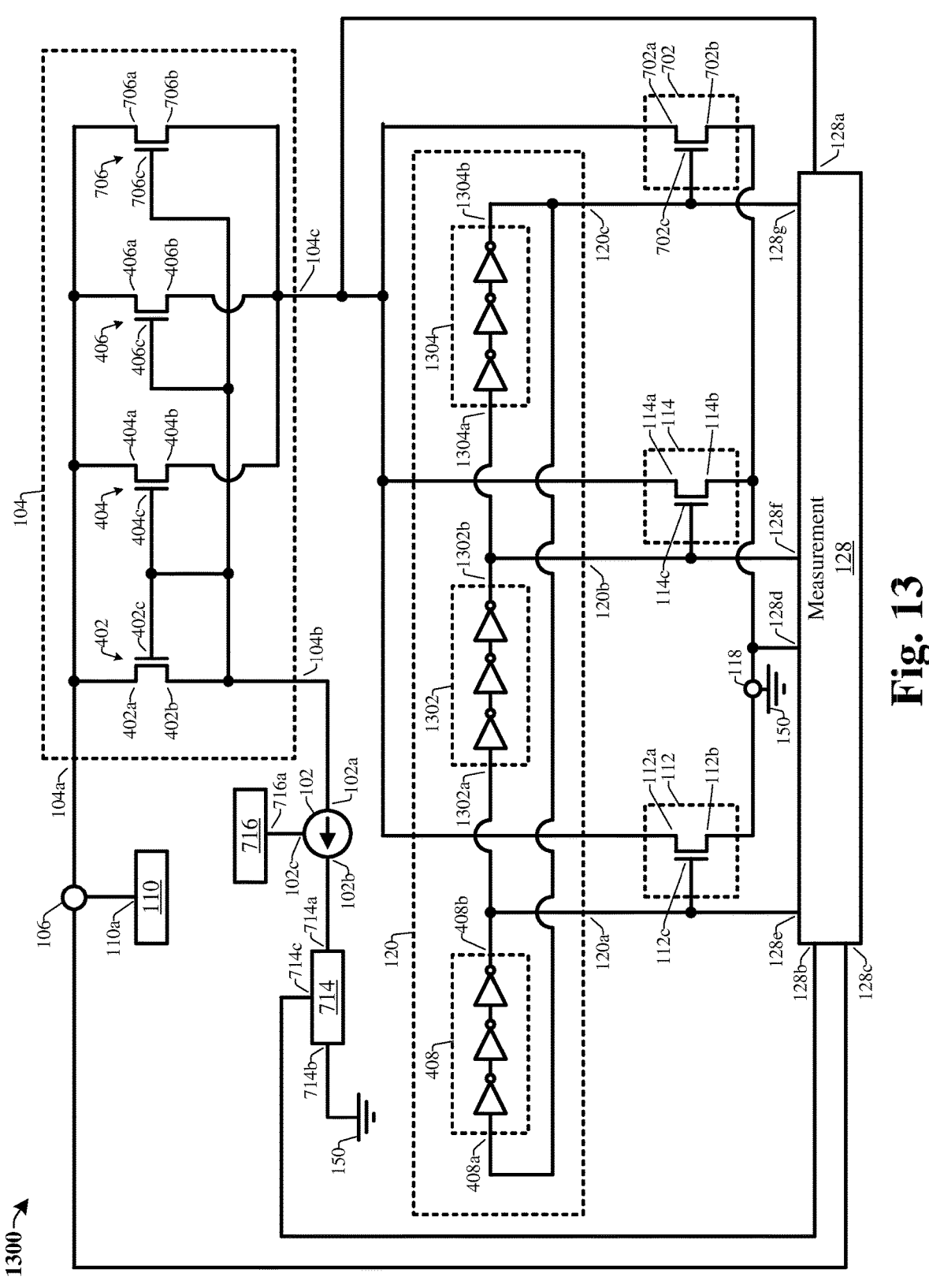
FIG. 13 illustrates a circuit diagram of some other embodiments of the system of FIG. 9.

FIG. 13 illustrates a circuit diagram 1300 of some embodiments of the system of FIG. 9 in which the ring oscillator circuit 120 includes a second inverter chain 1302 and a third inverter chain 1304.

The first inverter chain 408 comprises the first plurality of inverters coupled in series between the input terminal 408a and the output terminal 408b of the first inverter chain 408. The second inverter chain 1302 is coupled to the first inverter chain 408. The second inverter chain 102 comprises a second plurality of inverters coupled in series between an input terminal 1302a and an output terminal 1302b of the second inverter chain 1302. Input terminal 1302a is coupled to output terminal 408b. The third inverter chain 1304 is coupled to the second inverter chain 1302. The third inverter chain 1304 comprises a third plurality of inverters coupled in series between an input terminal 1304a and an output terminal 1304b of the third inverter chain 1304. Input terminal 1304a is coupled to output terminal 1302b. Output terminal 1304b is coupled to input terminal 408a.

The total number of inverters in the ring oscillator circuit 120 is an odd number. In some embodiments, each inverter chain may have the same number of inverters. In some other embodiments, the first inverter chain 408 may include more inverters than the second inverter chain 1302 and more inverters than the third inverter chain 1304. Although three inverters are shown in each chain in the embodiments illustrated in FIG. 13, it will be appreciated that in some embodiments, each inverter chain could alternatively include some other number of inverters.

In some cases, when the number of inverters in the second inverter chain 1302 and the third inverter chain 1304 is large and/or approximately equal to the number of inverters in the first chain 408, a delay may be observed between the switching of the test transistors. For example, as shown by signals 1408, 1412 of FIG. 14, the second test transistor 114 switches after a delay in response to the first test transistor 112 switching. Likewise, as shown by signals 1412, 1416 of FIG. 14, the third test transistor 702 switches after a delay in response to the second test transistor 114 switching. Consequently, the current through each test transistor varies due to the switching delays, as shown by signals 1410, 1414, 1418 of FIG. 14.

Although the embodiment illustrated in FIG. 13 shows the system including three test transistors, it will be appreciated that in some other embodiments, the system may include some other number of test transistors (e.g., four test transistors, five test transistors, six test transistors, etc.).

Figure 14:
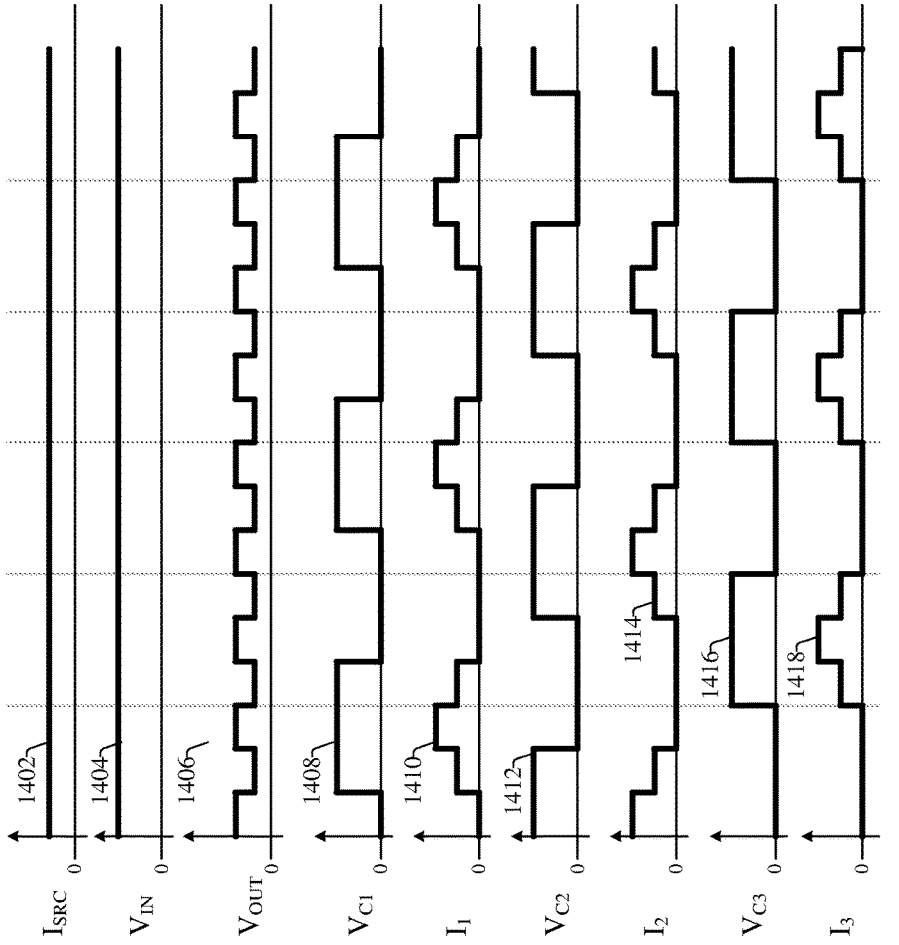
FIG. 14 illustrates a timing diagram corresponding to some embodiments of the system of FIG. 13.

FIG. 14 illustrates a timing diagram 1400 corresponding to some embodiments of the system of FIG. 13.

Signal 1402 is the source current $I_{SRC}$ generated by current source 102 over time. Signal 1404 is the voltage $V_{IN}$ at the first voltage supply terminal 106 over time. Signal 1406 is the voltage $V_{OUT}$ at the third terminal 104c of the current supply circuit 104 over time. Signal 1408 is the voltage $V_{C1}$ at the control terminal 112c of the first test transistor 112 over time. Signal 1410 is the current $I_1$ through the first terminal 112a of the first test transistor 112 over time. Signal 1412 is the voltage $V_{C2}$ at the control terminal 114c of the second test transistor 114 over time. Signal 1414 is the current $I_2$ through the first terminal 114a of the second test transistor 114 over time. Signal 1416 shows the voltage $V_{C3}$ at the control terminal 702c of the third test transistor 702 over time. Signal 1418 shows the current $I_3$ through the first terminal 702a of the third test transistor 702 over time.

Figure 15:
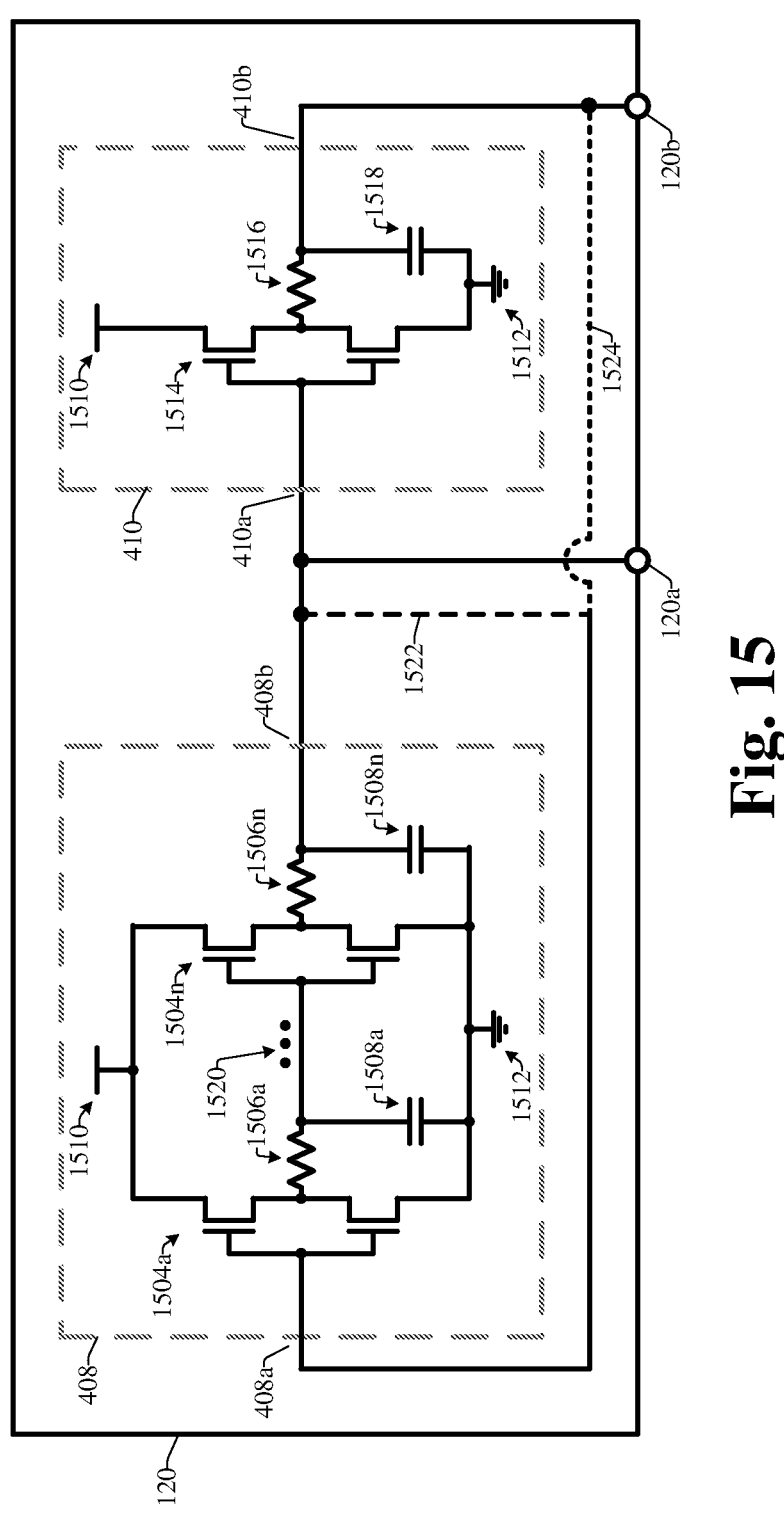
FIG. 15 illustrates a circuit diagram of some embodiments of a ring oscillator circuit.

FIG. 15 illustrates a circuit diagram 1500 of some embodiments of the ring oscillator circuit 120.

The first inverter chain 408 comprises a plurality of complementary transistor inverters. For example, the first inverter chain 408 comprises a first complementary transistor inverter 1504a and an Nth complementary transistor inverter 1504n. The first complementary transistor inverter 1504a comprises a P-channel transistor and an N-channel transistor. The control terminal of the P-channel transistor and the control terminal of the N-channel transistor are coupled together and to the input terminal 408a. The first terminal of the P-channel transistor is coupled to a first voltage supply terminal 1510 (e.g., a voltage source). The second terminal of the N-channel transistor is coupled to a second voltage supply terminal 1512 (e.g., ground). The second terminal of the P-channel transistor and the first terminal of the N-channel transistor are coupled together and to a first terminal of a first resistor 1506a. A second terminal of the first resistor 1506a is coupled to a first terminal of a first capacitor 1508a and to the next complementary transistor inverter (here shown as the Nth complementary transistor inverter 1504n). The second terminal of the first capacitor 1508a is coupled to the second voltage supply terminal 1512.

The Nth complementary transistor inverter 1504n is similarly coupled to an Nth resistor 1506n and an Nth capacitor 1508n. The inverter chain may include any number of inverters, resistors, and capacitors, as illustrated by ellipses 1520.

The inverter chain 408 is coupled to the first inverter 410 and to terminal 120a. The first inverter 410 similarly includes a complementary transistor inverter 1514. In some embodiments, the inverter 410 may also similarly include a resistor 1516 and a capacitor 1518 as shown. The first inverter 410 is coupled to terminal 120b.

In some embodiments (e.g., as shown in FIGS. 4, 7, and 8), the output of the inverter chain 408 is coupled to the input of the inverter chain 408, as illustrated by dashed line 1522. In some other embodiments (e.g., as shown in FIGS. 9, 11, and 13), the output of the inverter 410 is coupled to the input of the inverter chain 408, as shown by dashed line 1524.

Figure 16:
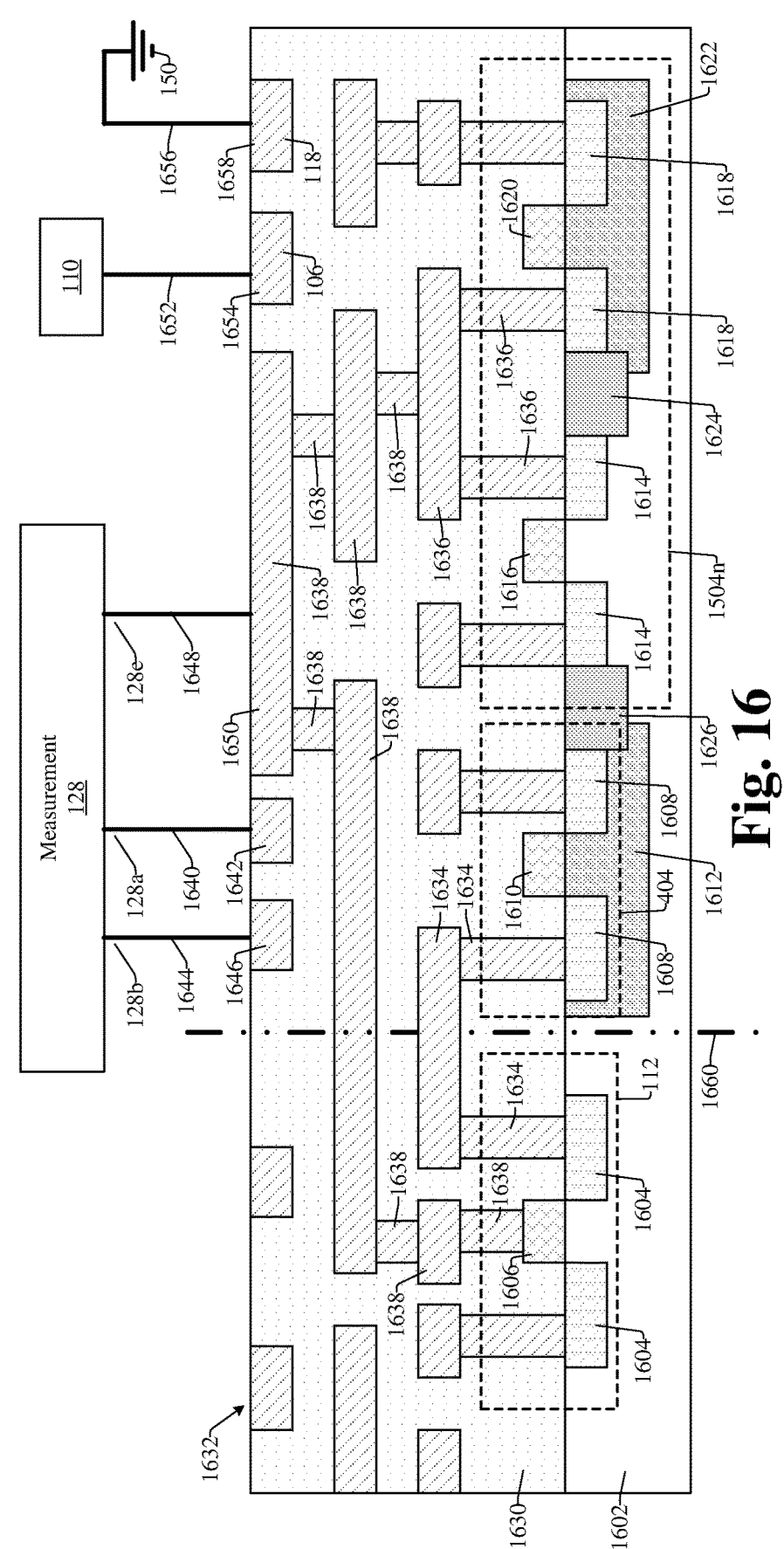
FIG. 16 illustrates a cross-sectional view of some embodiments of a portion of a semiconductor wafer.

FIG. 16 illustrates a cross-sectional view 1600 of some embodiments of a portion of a semiconductor wafer. The inverters which form the ring oscillator 120, the mirror transistors which form the current supply circuit 104, and the test transistors are formed on the wafer and are coupled by conductive interconnect on the wafer. The measurement circuit 128 is coupled to the wafer by external wires/probes so that the so that the test transistors can be characterized while on the wafer (e.g., before dicing and packaging). Scribe lines extend between the test transistors and other components of the system (e.g., the current supply circuit 104 and the ring oscillator circuit 120) so that the test transistors can be separated from other components of the system and separately packaged after characterization is complete.

For example, the first test transistor 112, the first secondary mirror transistor 404, and the Nth complementary transistor inverter 1504n are disposed along a semiconductor substrate 1602. The first test transistor 112 includes a pair of source/drain regions 1604 and a gate 1606 along the substrate 1602. Similarly, the first secondary mirror transistor 404 includes a pair of source/drain regions 1608 and a gate 1610 along the substrate 1602. The pair of source/drain regions 1608 of mirror transistor 404 are in a well region 1612 of the substrate 1602. The complementary transistor inverter 1504n includes a first pair of source/drain regions 1614 and a first gate 1616 along the substrate 1602. The complementary transistor inverter 1504n further includes a second pair of source/drain regions 1618 and a second gate 1620 along the substrate 1602. The second pair of source/drain regions 1618 are in a second well region 1622 of the substrate 1602. A first dielectric isolation region 1624 is between the first pair of source/drain regions 1614 and the second pair of source/drain regions 1618. A second dielectric isolation region 1626 is between mirror transistor 404 and complementary transistor inverter 1504n.

In some embodiments, the substrate 1602, source/drain regions 1608, and source/drain regions 1618 have a first doping type (e.g., p-type), and source/drain regions 1604, well region 1612, source/drain regions 1614, and well region 1622 have a second doping type (e.g., n-type). Source/drain region(s) may refer to a source or a drain, individually or collectively dependent upon the context.

A dielectric structure 1630 and a conductive interconnect structure 1632 are over the substrate 1602. The dielectric structure 1630 comprises a plurality of dielectric layers. The conductive interconnect structure 1632 comprises plurality of conductive interconnects. A first set of interconnects 1634 of the interconnect structure 1632 couple a source/drain region 1604 of test transistor 112 to a source/drain region 1608 of mirror transistor 404. A second set of interconnects 1636 couple one of source/drain regions 1614 to one of source/drain regions 1618. A third set of conductive interconnects 1638 couple the gate 1606 of test transistor 112 to the second set of interconnects 1636.

In some embodiments, the measurement circuit 128 is separate from the wafer and coupled to the devices on the wafer by external wires/probes. For example, a first wire/probe 1640 couples the terminal 128a of measurement circuit 128 to a first conductive pad 1642 of the interconnect structure 1632, a second wire/probe 1644 couples terminal 128b of measurement circuit 128 to a second conductive pad 1646 of the interconnect structure 1632, and a third wire/probe 1648 couples terminal 128e of measurement circuit 128 to a third conductive pad 1650 of the interconnect structure 1632. In some embodiments, the third conductive pad 1650 is part of the third set of conductive interconnects 1638 which couples the gate 1606 of test transistor 112 to the second set of interconnects 1636.

In some embodiments, the current source (e.g., 102 of FIG. 1) is on the wafer. In some other embodiments, the current source is external to the wafer and coupled to the devices on the wafer by external wiring. The voltage source 110 is external to the wafer. A wire 1652 couples the voltage source 110 to a fourth conductive pad 1654 (e.g., the first voltage supply terminal 106). A wire 1656 couples a fifth conductive pad 1658 (e.g., the second voltage supply terminal 118) to ground 150.

The wafer is diced along dicing streets (e.g., scribe lines) after characterizing the test transistors so that the test transistors can be separately packaged. For example, a first dicing street 1660 is between the first test transistor 112 and other components of the system (e.g., mirror transistor 404 and complementary transistor inverter 1504n).

Figure 17:
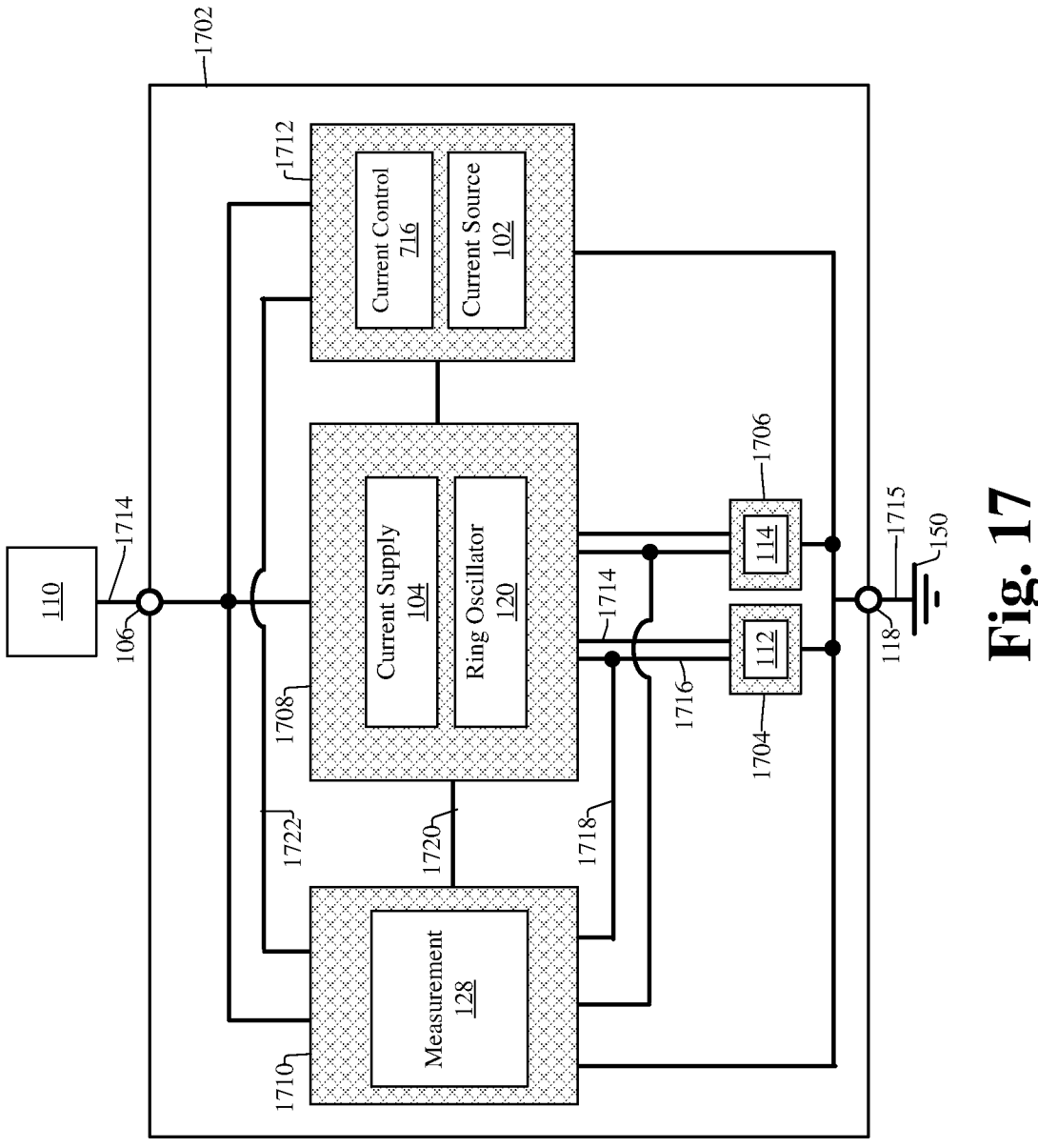
FIG. 17 illustrates a diagram of some embodiments of a device in which the system is on a common circuit board.

FIG. 17 illustrates a diagram 1700 of some embodiments of a device in which the test transistors, the current supply circuit 104, the ring oscillator circuit 120, the current source 102, the measurement circuit 128 are on a common circuit board 1702. The test transistors are temporarily attached to circuit board 1702 to undergo characterization after the test transistors have been diced and packaged.

In some embodiments, the first test transistor 112 is on a first integrated chip 1704, the second test transistor 114 is on a second integrated chip 1706, and so on. Further, the current supply circuit 104 and the ring oscillator circuit 120 are on a separate integrated chip 1708. Furthermore, the measurement circuit 128 is on a separate integrated chip 1710. In some embodiments, the current source 102 (and current control circuit 716) is on a separate integrated chip 1712. In some other embodiments, the current source 102 (and current control circuit 716) is on integrated chip 1708 with the current supply circuit 104 and the ring oscillator circuit 120.

The integrated chips are arranged on (e.g., soldered to) the circuit board 1702. Wires extend along the circuit board 1702 and intercouple integrated chips. For example, a first wire 1714 extends along the circuit board 1702 and couples the first test transistor 112 to the current supply circuit 104, a second wire 1716 extends along the circuit board 1702 and couples the first test transistor 112 to the ring oscillator circuit 120, a third wire 1718 extends along the circuit board 1702 and couples the first test transistor 112 to the measurement circuit 128, a fourth wire 1720 extends along the circuit board 1702 and couples the current supply circuit 104 to the measurement circuit 128, and a fifth wire 1722 extends along the circuit board 1702 and couples the current source 102 to the measurement circuit 128. Additional wires extend along the circuit board 1702 and intercouple different devices, as shown in FIG. 17. In some embodiments, the voltage source 110 and ground 150 are coupled to the circuit board 1702 by external wires 1714, 1715.

Thus, the present disclosure relates to system for determining operating characteristics of a plurality of inter-coupled test transistors under dynamic conditions to improve the accuracy of the determined operating characteristics.

Accordingly, in some embodiments, the present disclosure relates to a system including a current source, a current supply circuit, a first test transistor, a second test transistor, a measurement circuit, and a ring oscillator circuit. The current source has a first terminal and a second terminal. The current supply circuit has a first terminal coupled to a first voltage supply terminal, a second terminal coupled to the first terminal of the current source, and a third terminal. The first test transistor has a first terminal coupled to the third terminal of the current supply circuit, a second terminal coupled to a second voltage supply terminal, and a control terminal. The second test transistor has a first terminal coupled to the third terminal of the current supply circuit, a second terminal coupled to the second voltage supply terminal, and a control terminal. The measurement circuit has a first terminal coupled to the third terminal of the current supply circuit and a second terminal coupled to the current source. The ring oscillator circuit has a first terminal coupled to the control terminal of the first test transistor and a second terminal coupled to the control terminal of the second test transistor.

In other embodiments, the present disclosure relates to a system including a current source, a current supply circuit, a first test transistor, a second test transistor, a measurement circuit, and a ring oscillator circuit. The current source is configured to generate a source current. The current supply circuit is configured to receive the source current and output a supply current in response to receiving the source current. The first test transistor is configured to pass a first portion of the supply current in response to the current supply circuit outputting the supply current. The second test transistor is configured to pass a second portion of the supply current in response to the current supply circuit outputting the supply current. The measurement circuit is configured to measure a current at the current source and measure a voltage across the first test transistor and the second test transistor. The ring oscillator circuit is configured to output a first oscillating signal to a control terminal of the first test transistor and output a second oscillating signal to a control terminal of the second test transistor. The second oscillating signal is inverted relative to the first oscillating signal.

In yet other embodiments, the present disclosure relates to a method. A source current is received and a supply current is provided to a first test transistor and a second test transistor in response to receiving the source current. A first oscillating signal is generated and provided to a control terminal of the first test transistor. The first oscillating signal is inverted, thereby forming a second oscillating signal, and the second oscillating signal is provided to a control terminal of the second test transistor. A voltage across the first test transistor and the second test transistor is measured. The source current is measured. One or more operating characteristics of the first test transistor and the second test transistor are determined based on the measured voltage across the first test transistor and the second test transistor and based on the measured source current.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system comprising:
a current source having a first terminal and a second terminal;
a current supply circuit having a first terminal coupled to a first voltage supply terminal, a second terminal coupled to the first terminal of the current source, and a third terminal;
a first test transistor having a first terminal coupled to the third terminal of the current supply circuit, a second terminal coupled to a second voltage supply terminal, and a control terminal;
a second test transistor having a first terminal coupled to the third terminal of the current supply circuit, a second terminal coupled to the second voltage supply terminal, and a control terminal;
a measurement circuit having a first terminal coupled to the third terminal of the current supply circuit and a second terminal coupled to the current source; and
a ring oscillator circuit having a first terminal coupled to the control terminal of the first test transistor and a second terminal coupled to the control terminal of the second test transistor.

2. The system of claim 1, wherein the ring oscillator circuit comprises:
an inverter chain having an input terminal and an output terminal, the inverter chain comprising a plurality of inverters coupled in series between the input terminal of the inverter chain and the output terminal of the inverter chain, the output terminal of the inverter chain coupled to the control terminal of the first test transistor; and
a first inverter having an input terminal coupled to the output terminal of the inverter chain and an output terminal coupled to the control terminal of the second test transistor.

3. The system of claim 2, wherein the output terminal of the inverter chain is coupled to the input terminal of the inverter chain.

4. The system of claim 3, wherein the plurality of inverters of the inverter chain is an odd numbered plurality.

5. The system of claim 3, further comprising:
a third test transistor having a first terminal coupled to the third terminal of the current supply circuit, a second terminal coupled to the second voltage supply terminal, and a control terminal coupled to the output terminal of the inverter chain.

6. The system of claim 3, further comprising:

a third test transistor having a first terminal coupled to the third terminal of the current supply circuit, a second terminal coupled to the second voltage supply terminal, and a control terminal, wherein the ring oscillator circuit further comprises a second inverter having an input terminal coupled to the output terminal of the first inverter and an output terminal coupled to the control terminal of the third test transistor.

7. The system of claim 2, wherein the output terminal of the first inverter is coupled to the input terminal of the inverter chain.

8. The system of claim 7, wherein the total number of inverters coupled between the input terminal of the inverter chain and the output terminal of the first inverter is an odd number.

9. The system of claim 2, further comprising:

a third test transistor having a first terminal coupled to the third terminal of the current supply circuit, a second terminal coupled to the second voltage supply terminal, and a control terminal, wherein the ring oscillator circuit further comprises a second inverter having an input terminal coupled to the output terminal of the first inverter and an output terminal coupled to the control terminal of the third test transistor and the input terminal of the inverter chain.

10. The system of claim 2, wherein the ring oscillator circuit further comprises a second inverter chain having an input terminal coupled to the output terminal of the first inverter chain and an output terminal coupled to the control terminal of the second test transistor, the second inverter chain comprising a second plurality of inverters, including the first inverter, coupled in series between the input terminal of the second inverter chain and the output terminal of the second inverter chain, and wherein the output terminal of the second inverter chain is coupled to the input terminal of the first inverter chain.

11. The system of claim 1, wherein the first test transistor is a first type of transistor, and wherein the second test transistor is a second type of transistor different than the first type of transistor.

12. The system of claim 1, wherein the current supply circuit comprises a current mirror, the current mirror comprising:

a first mirror transistor having a first terminal coupled to the first voltage supply terminal, a second terminal coupled to the first terminal of the current source, and a control terminal coupled to the second terminal of the first mirror transistor; and a second mirror transistor having a first terminal coupled to the first voltage supply terminal, a second terminal coupled to the third terminal of the current supply circuit, and a control terminal coupled to the control terminal of the first mirror transistor.

13. A system comprising:

a current source configured to generate a source current;

a current supply circuit configured to receive the source current and output a supply current in response to receiving the source current;

a first test transistor configured to pass a first portion of the supply current in response to the current supply circuit outputting the supply current;

a second test transistor configured to pass a second portion of the supply current in response to the current supply circuit outputting the supply current;

a measurement circuit configured to measure a current at the current source and measure a voltage across the first test transistor and the second test transistor; and a ring oscillator circuit configured to output a first oscillating signal to a control terminal of the first test transistor and output a second oscillating signal to a control terminal of the second test transistor, wherein the second oscillating signal is inverted relative to the first oscillating signal.

14. The system of claim 13, wherein the ring oscillator circuit comprises:

a first inverter chain configured to output the first oscillating signal to the control terminal of the first test transistor; and a first inverter configured to invert the first oscillating signal, thereby forming the second oscillating signal, and output the second oscillating signal to the control terminal of the second test transistor.

15. The system of claim 14, wherein the first inverter chain is configured to output the first oscillating signal to the first inverter and to an input terminal of the first inverter chain.

16. The system of claim 14, wherein the first inverter chain is configured to output the second oscillating signal to an input terminal of the first inverter chain.

17. The system of claim 13, wherein the measurement circuit is configured to determine an on-resistance of the first test transistor based on the measured current at the current source and the measured voltage across the first test transistor and the second test transistor.

18. A method comprising:

receiving a source current;

providing a supply current to a first test transistor and a second test transistor in response to receiving the source current;

generating a first oscillating signal and providing the first oscillating signal to a control terminal of the first test transistor;

inverting the first oscillating signal, thereby forming a second oscillating signal, and providing the second oscillating signal to a control terminal of the second test transistor;

measuring a voltage across the first test transistor and the second test transistor;

measuring the source current; and determining one or more operating characteristics of the first test transistor and the second test transistor based on the measured voltage across the first test transistor and the second test transistor and based on the measured source current.

19. The method of claim 18, wherein generating the first oscillating signal comprises repeatedly inverting a signal an odd-numbered plurality of times.

20. The method of claim 18, further comprising:

measuring a voltage at the control terminal of the first test transistor;

measuring a voltage at the control terminal of the second test transistor;

determining an amount of charge at the control terminal of the first test transistor at which the first test transistor turns on based on the measured voltage at the control terminal of the first test transistor and the measured voltage across the first test transistor and the second test transistor; and determining an amount of charge at the control terminal of the second test transistor at which the second test transistor turns on based on the measured voltage at the control terminal of the second test transistor and the measured voltage across the first test transistor and the second test transistor.

* * * * *